US012635292B2

(12) United States Patent
Kim et al.

(10) Patent No.: US 12,635,292 B2
(45) Date of Patent: May 19, 2026

(54) LIGHT EMITTING DEVICE AND PRODUCT INCLUDING SAME

(71) Applicant: SEOUL VIOSYS CO., LTD., Ansan-si (KR)

(72) Inventors: Jae Kwon Kim, Ansan-si (KR); Kyoung Wan Kim, Ansan-si (KR); Wan Tae Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 540 days.

(21) Appl. No.: 18/004,533

(22) PCT Filed: Jul. 6, 2021

(86) PCT No.: PCT/KR2021/008582
§ 371 (c)(1),
(2) Date: Jan. 6, 2023

(87) PCT Pub. No.: WO2022/010229
PCT Pub. Date: Jan. 13, 2022

(65) Prior Publication Data
US 2023/0246149 A1     Aug. 3, 2023

(30) Foreign Application Priority Data

Jul. 6, 2020     (KR) ........................ 10-2020-0083114
Jul. 5, 2021     (KR) ........................ 10-2021-0088109

(51) Int. Cl.
H10H 20/01          (2025.01)
H10H 20/814         (2025.01)
(Continued)

(52) U.S. Cl.
CPC ........ H10H 20/036 (2025.01); H10H 20/814 (2025.01); H10H 20/851 (2025.01);
(Continued)

(58) Field of Classification Search
None
See application file for complete search history.

(56) References Cited

U.S. PATENT DOCUMENTS

2004/0256974 A1* 12/2004 Mueller-Mach ... C09K 11/7774
                                                      313/485
2009/0200568 A1*  8/2009 Horie ..................... H10H 20/84
                                                       438/34
(Continued)

FOREIGN PATENT DOCUMENTS

KR     1020170099025 A     8/2017
KR     1020180059157 A     6/2018
(Continued)

OTHER PUBLICATIONS

European Search Report of corresponding European Application No. 21837425, dated Jun. 18, 2024.
(Continued)

*Primary Examiner* — Feifei Yeung Lopez
(74) *Attorney, Agent, or Firm* — Perkins Coie LLP

(57) ABSTRACT

This light emitting device comprises: a substrate; a light emitting laminate disposed on the substrate; first and second electrodes provided on the light emitting laminate; first and second bumps provided on the first and second electrodes, respectively; a passivation film which is provided on the substrate, exposes portions of the upper surfaces of the first and second bumps, and covers the laminate; and a light conversion layer covering the rear surface of the substrate, a side surface of the substrate, and a side surface of the passivation film.

19 Claims, 15 Drawing Sheets

(51) Int. Cl.

| | |
|---|---|
| *H10H 20/851* | (2025.01) |
| *H10H 20/852* | (2025.01) |
| *H10H 20/856* | (2025.01) |
| *H10H 20/857* | (2025.01) |
| *H10W 90/00* | (2026.01) |

(52) U.S. Cl.
CPC .... *H10H 20/8512* (2025.01); *H10H 20/8514* (2025.01); *H10H 20/852* (2025.01); *H10H 20/856* (2025.01); *H10H 20/857* (2025.01); *H10W 90/00* (2026.01)

(56) References Cited

U.S. PATENT DOCUMENTS

| | | | | |
|---|---|---|---|---|
| 2010/0230691 | A1* | 9/2010 | Inoue | C09K 11/77922 |
| | | | | 252/301.4 F |
| 2015/0207046 | A1* | 7/2015 | Ikegami | H10H 20/8516 |
| | | | | 438/27 |
| 2015/0333230 | A1* | 11/2015 | Moon | H10H 20/841 |
| | | | | 257/88 |
| 2016/0233393 | A1* | 8/2016 | Okuno | H10H 20/854 |
| 2019/0172978 | A1 | 6/2019 | Chen et al. | |

FOREIGN PATENT DOCUMENTS

| | | |
|---|---|---|
| KR | 1020180086840 A | 8/2018 |
| WO | 2009010762 A1 | 1/2009 |

OTHER PUBLICATIONS

International Search Report from PCT/KR2021/008582 dated Oct. 25, 2021.

Office Action from related corresponding Korean Application No. 10-2021-0088109, dated Sep. 15, 2025. (5 pages).

\* cited by examiner

[FIG. 1A]
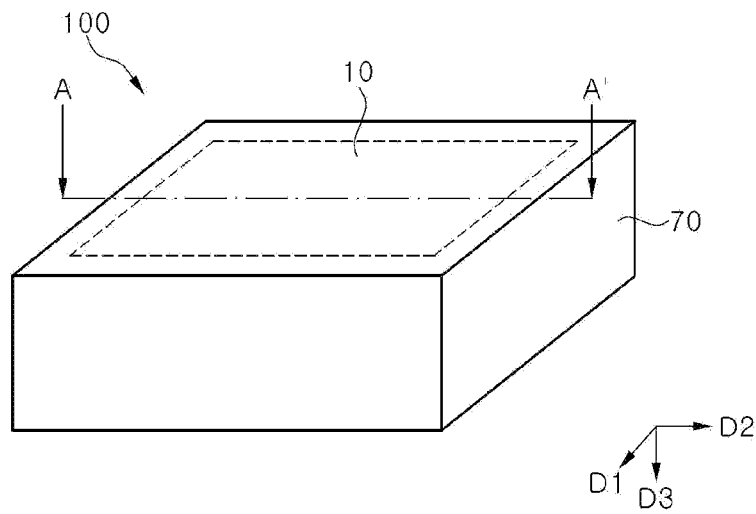
[FIG. 1B]
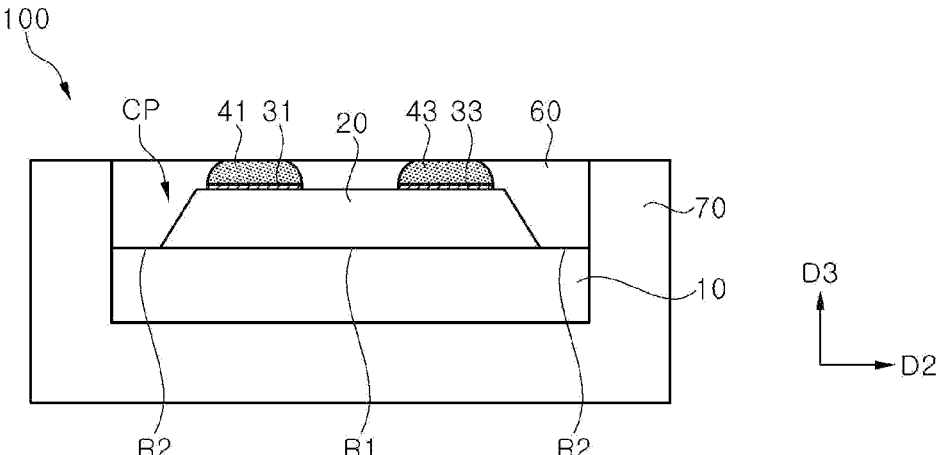

[FIG. 2]
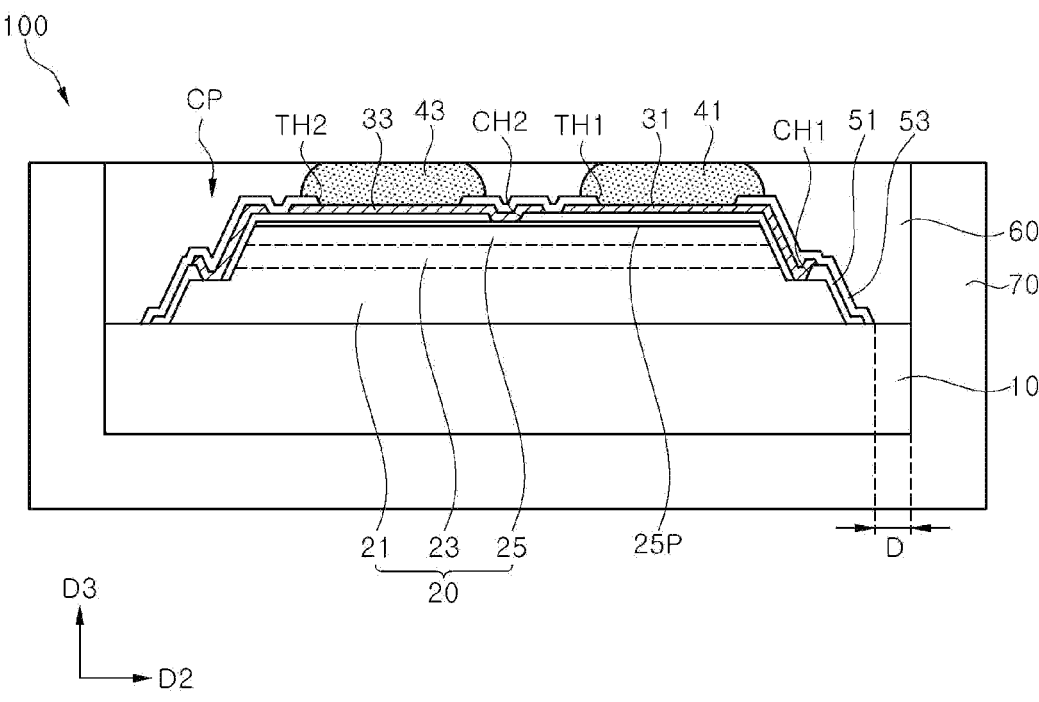
[FIG. 3]
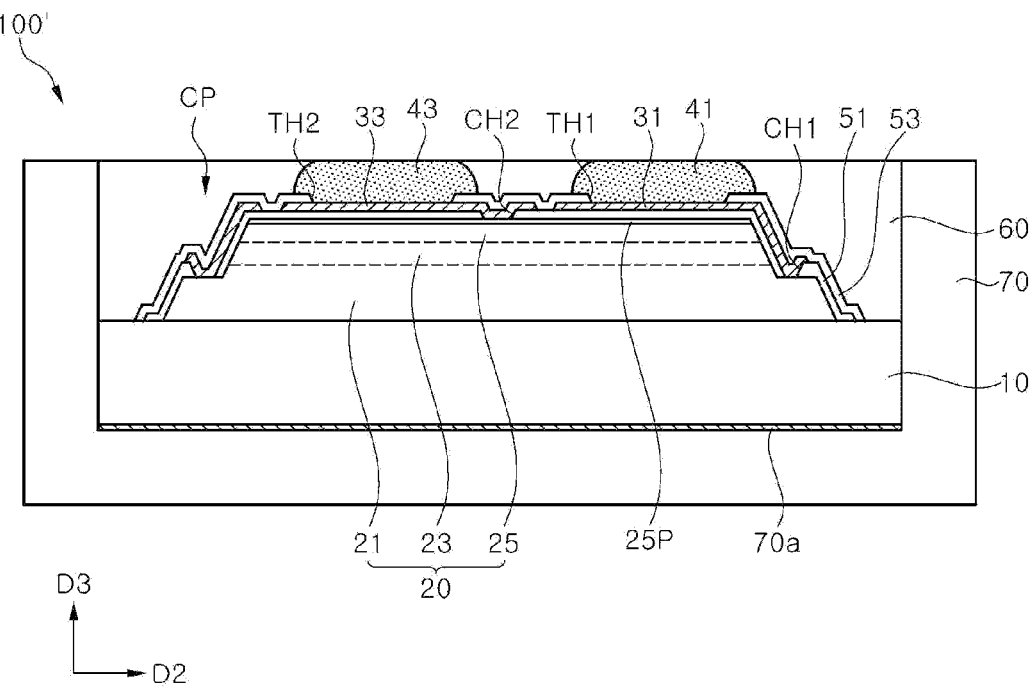

[FIG. 4]
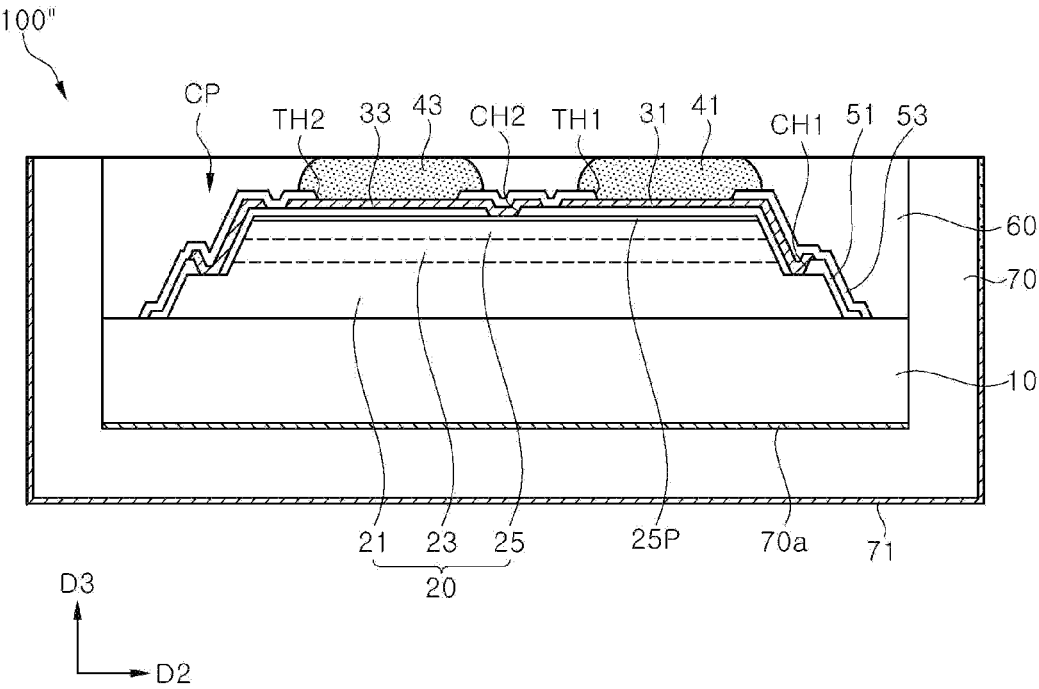
[FIG. 5A]
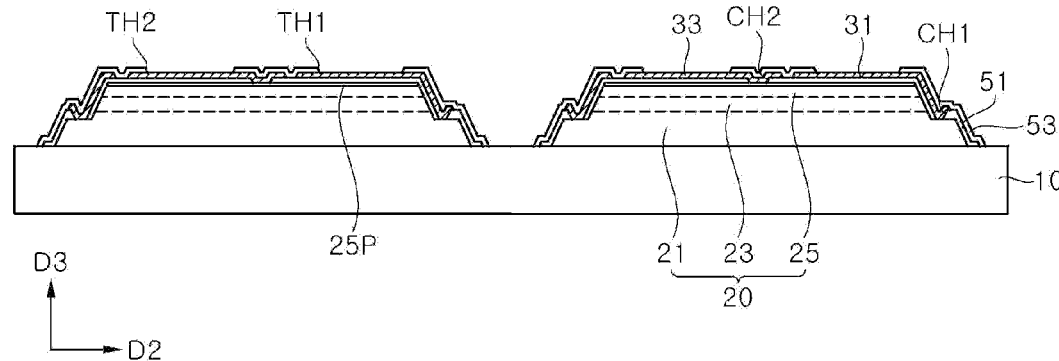

[FIG. 5B]
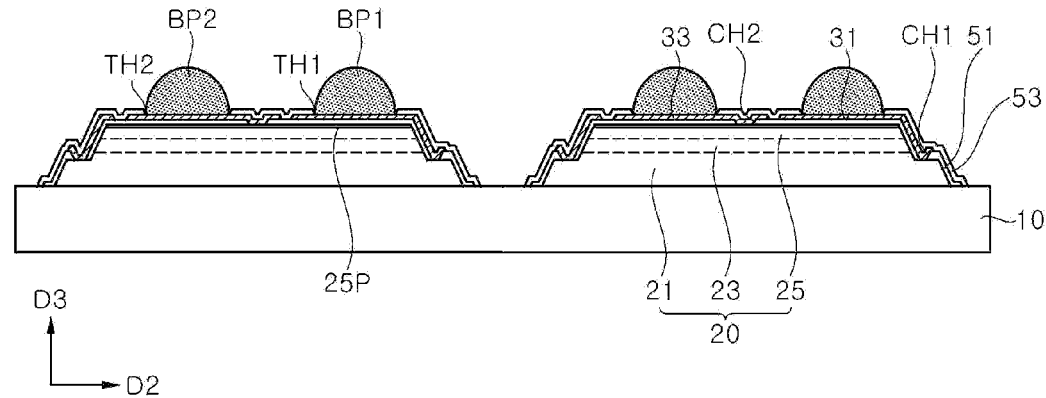
[FIG. 5C]
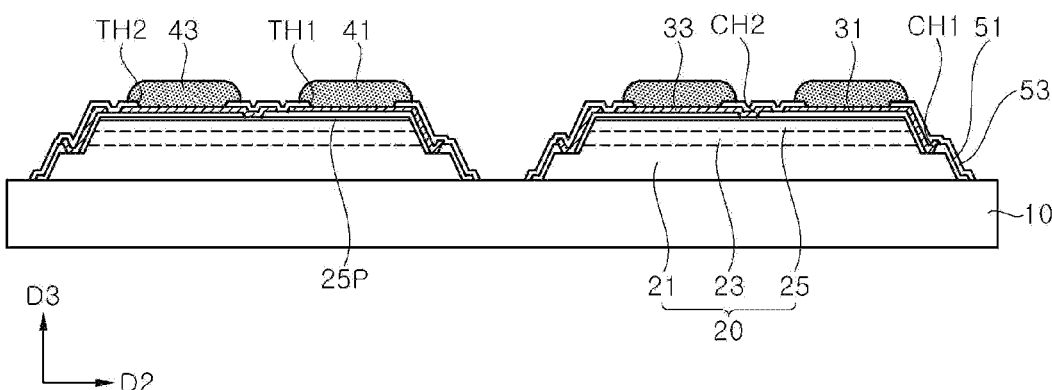
[FIG. 5D]
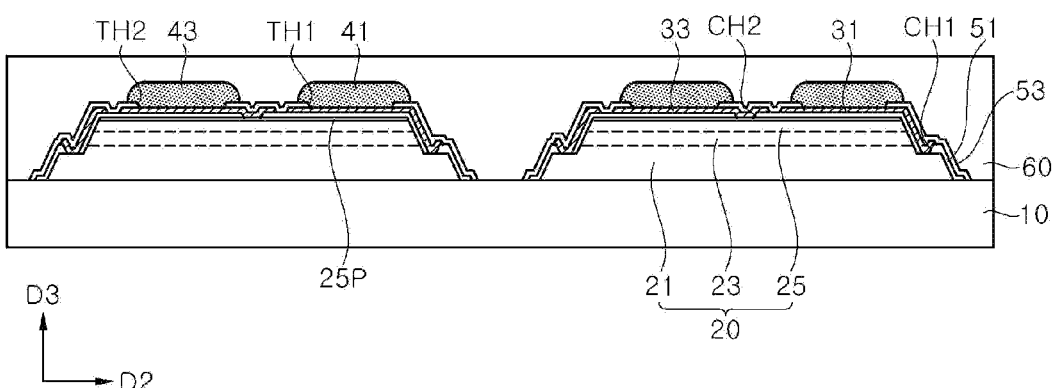

[FIG. 5E]
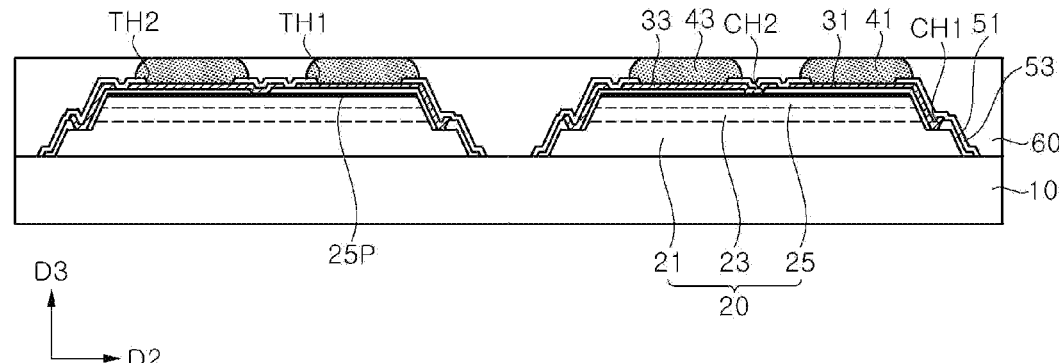
[FIG. 5F]
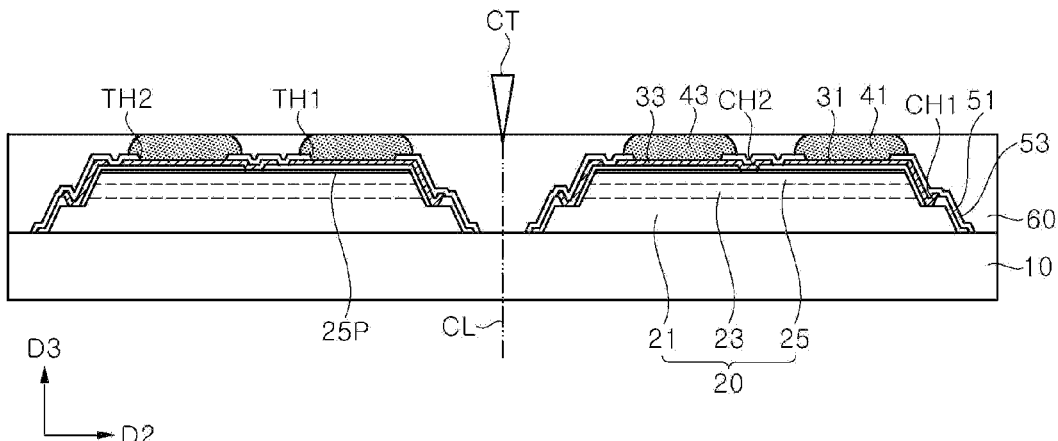
[FIG. 5G]
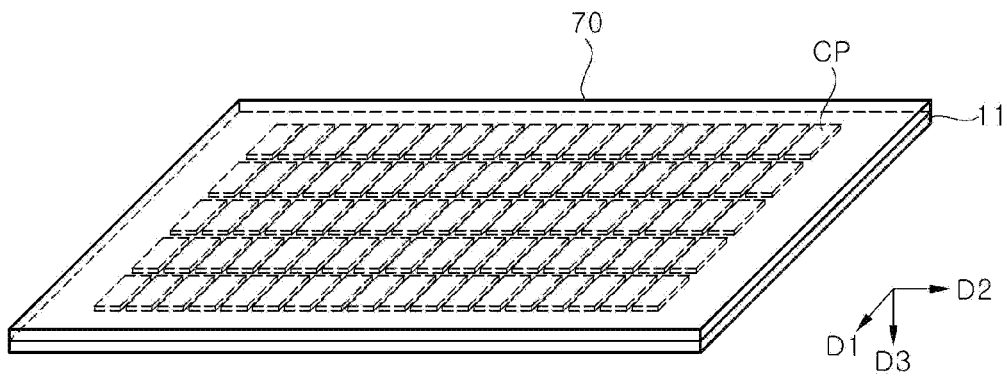

[FIG. 5H]
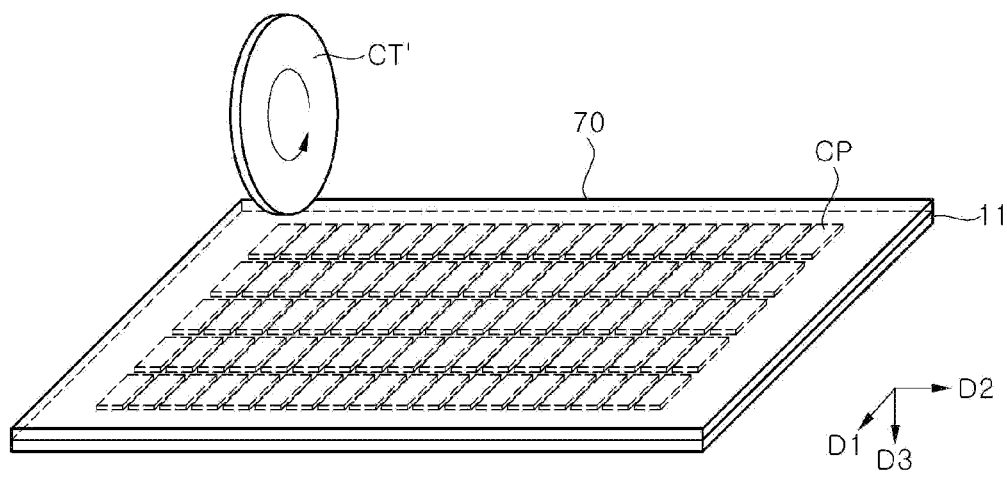
[FIG. 6]
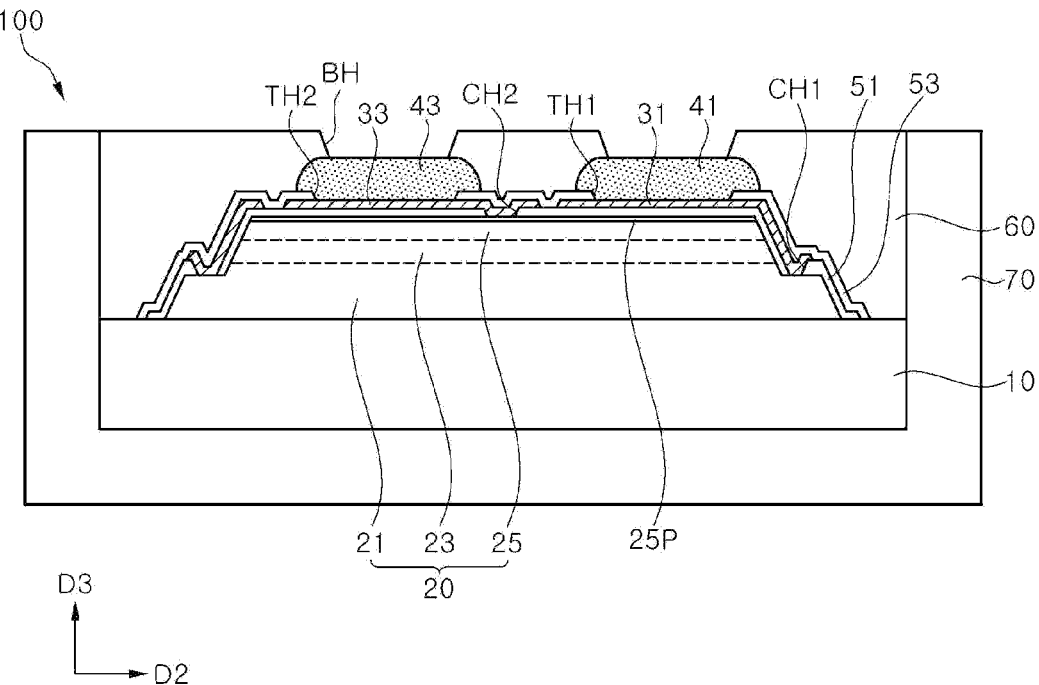

[FIG. 7A]
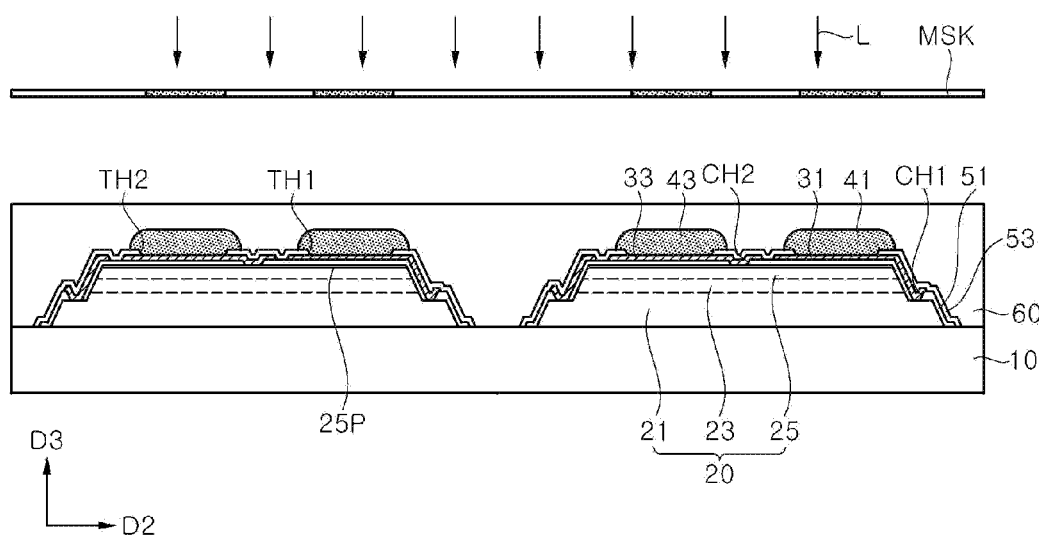
[FIG. 7B]
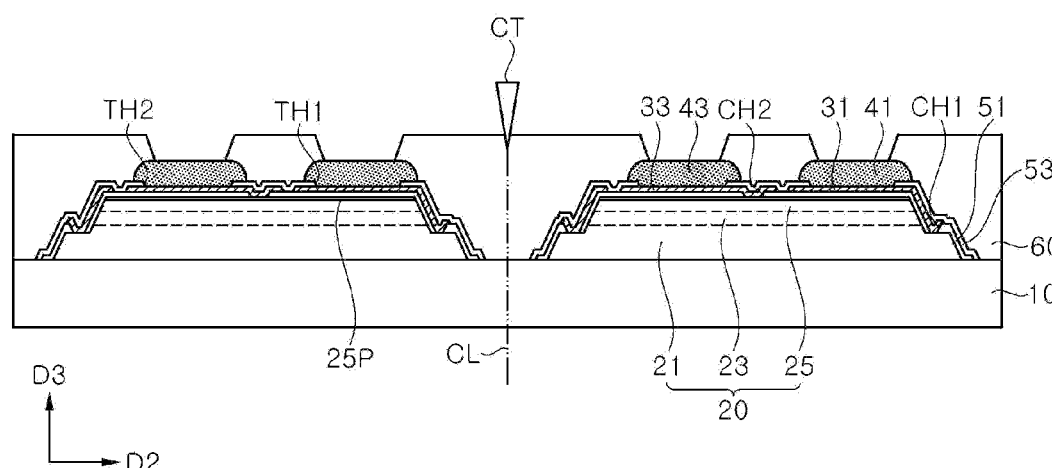

[FIG. 8]
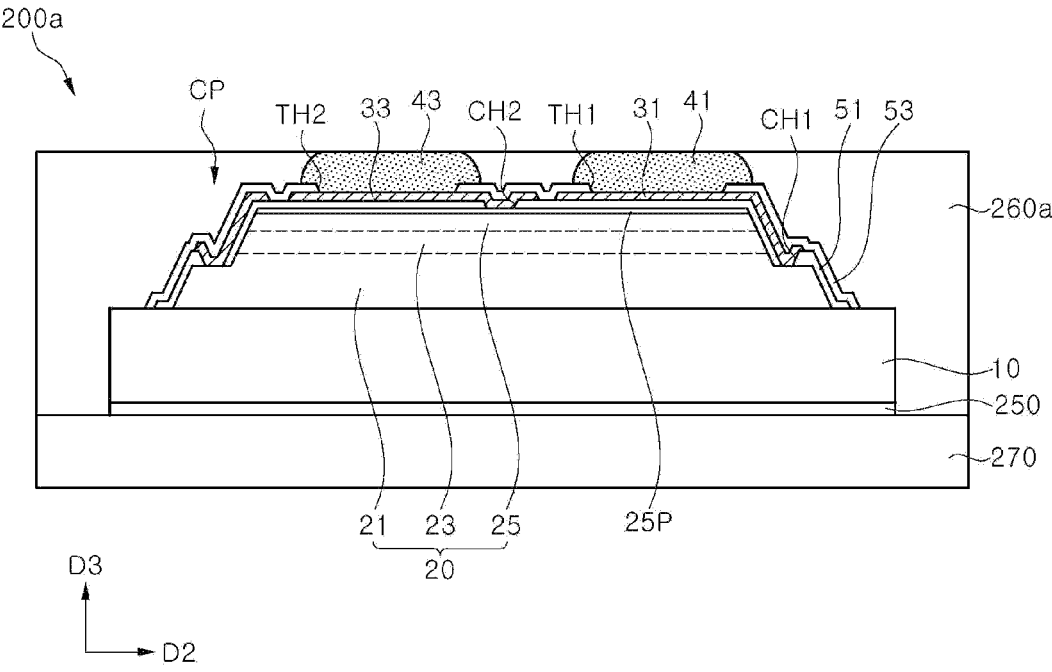
[FIG. 9]
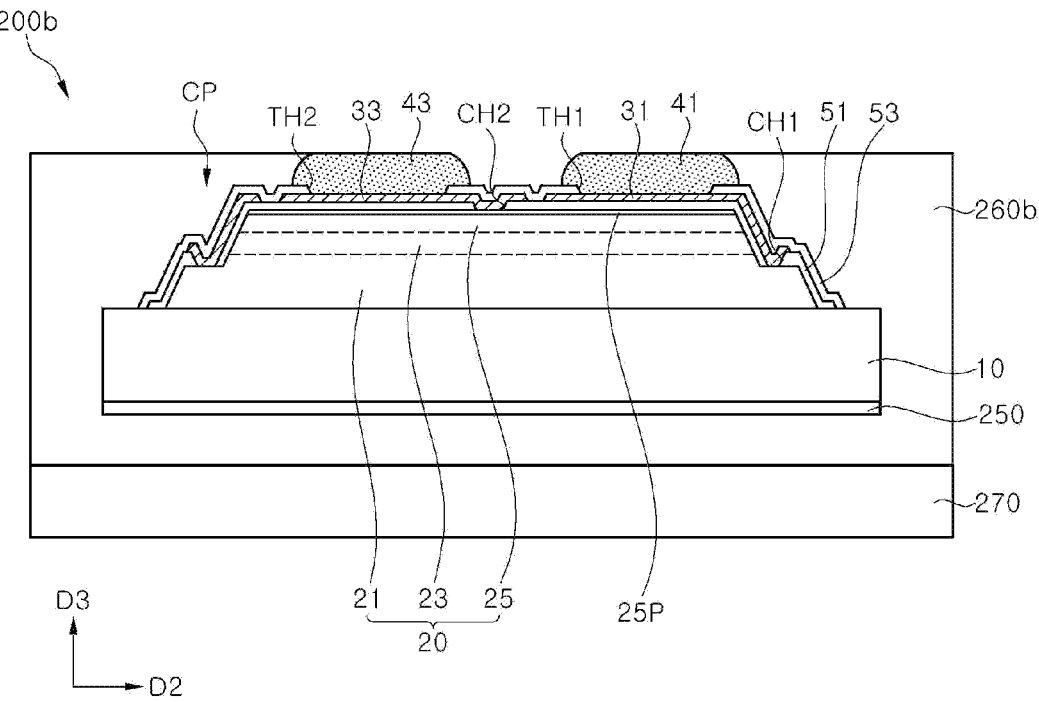

[FIG. 10]
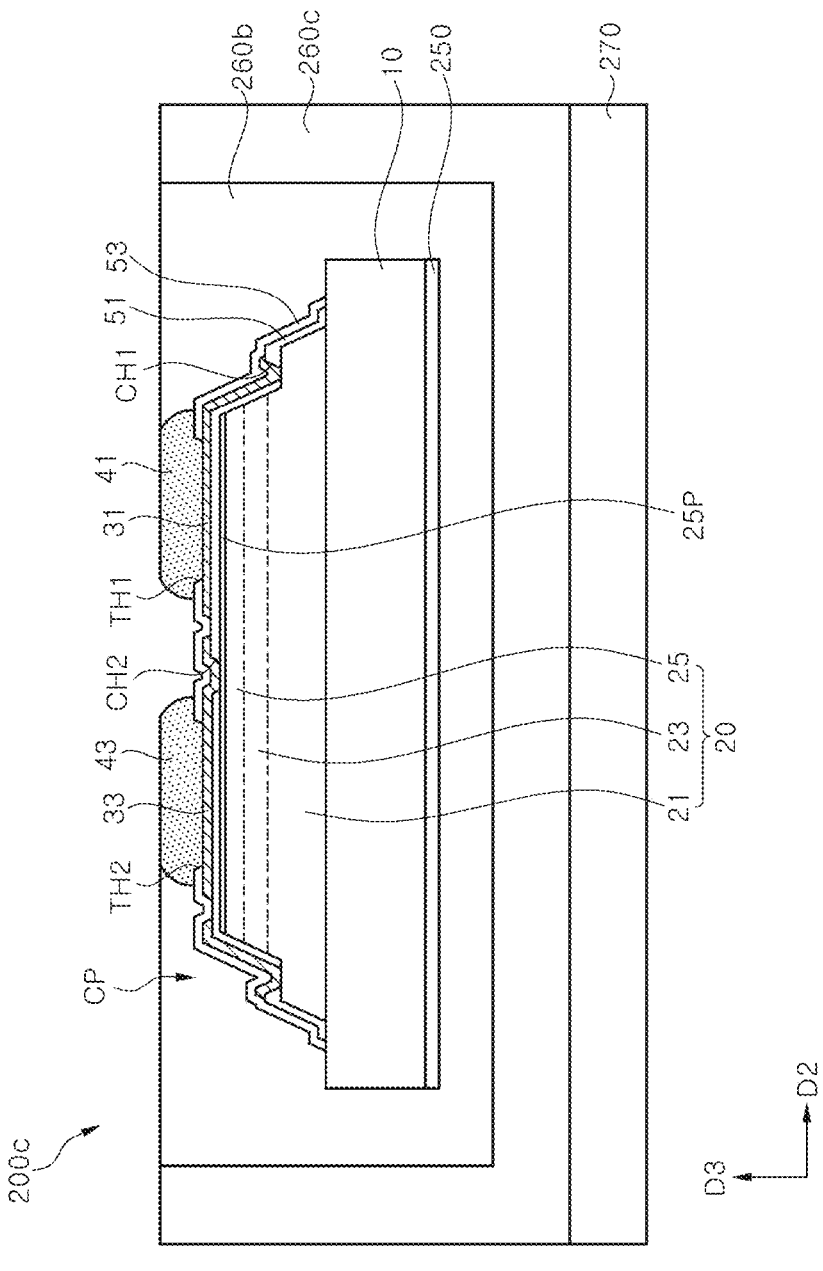

[FIG. 11]
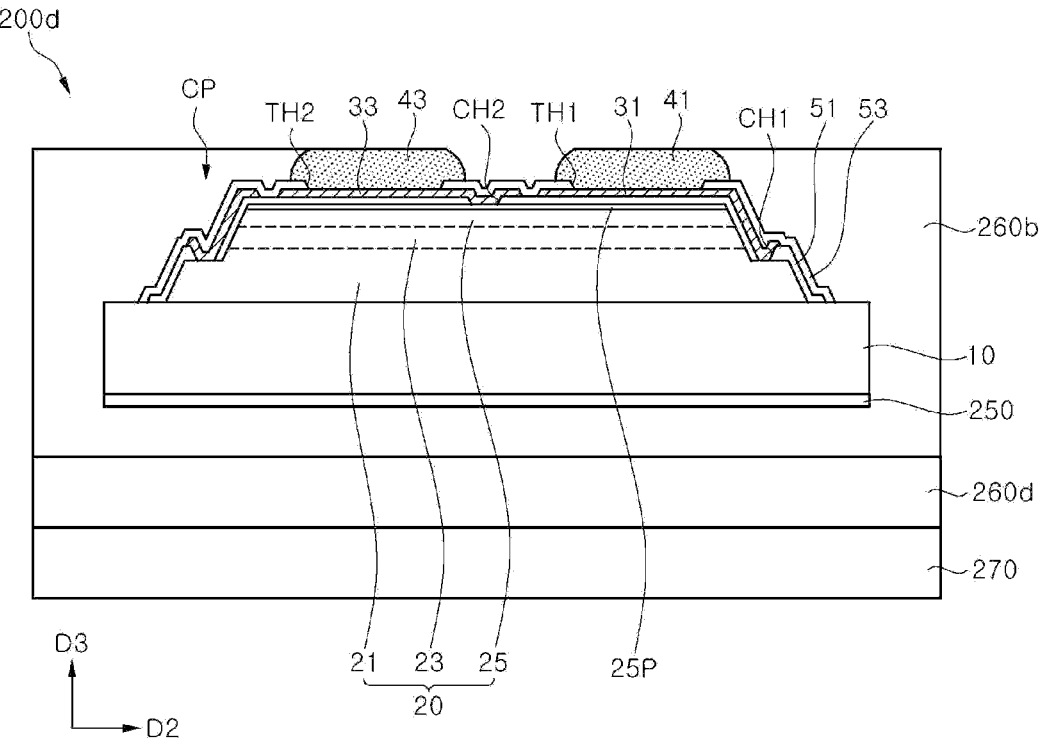
[FIG. 12]
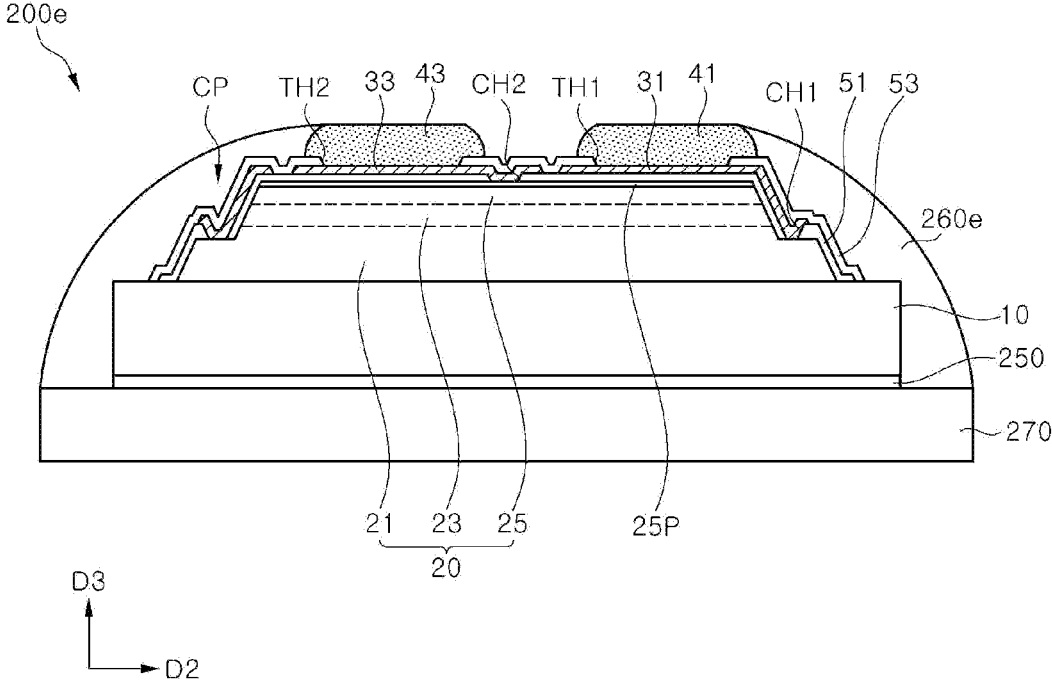

[FIG. 13]
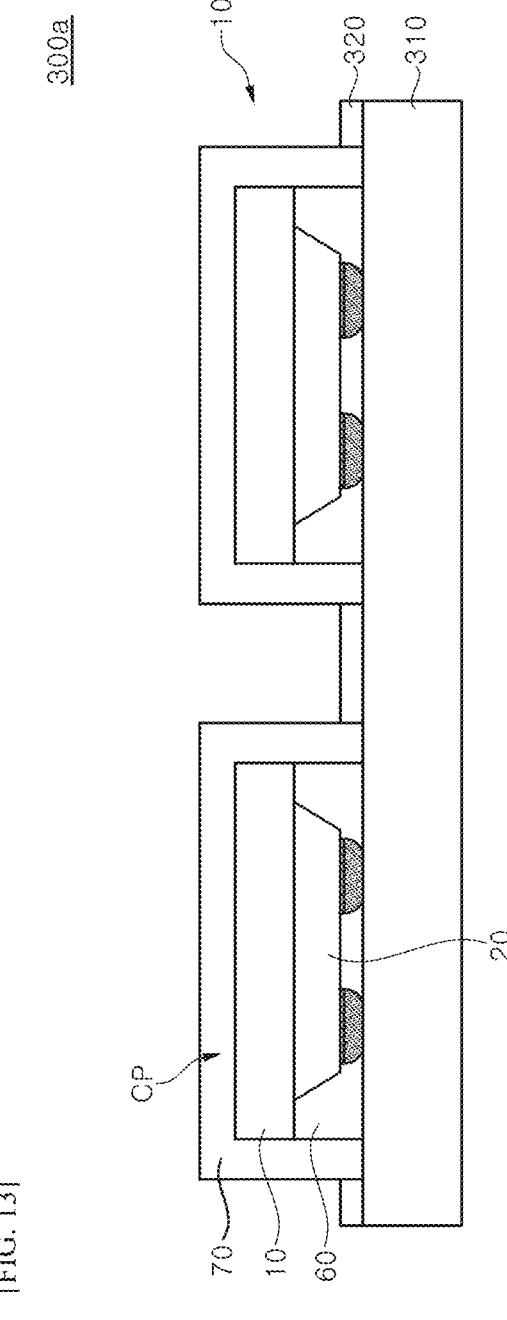

[FIG. 14]
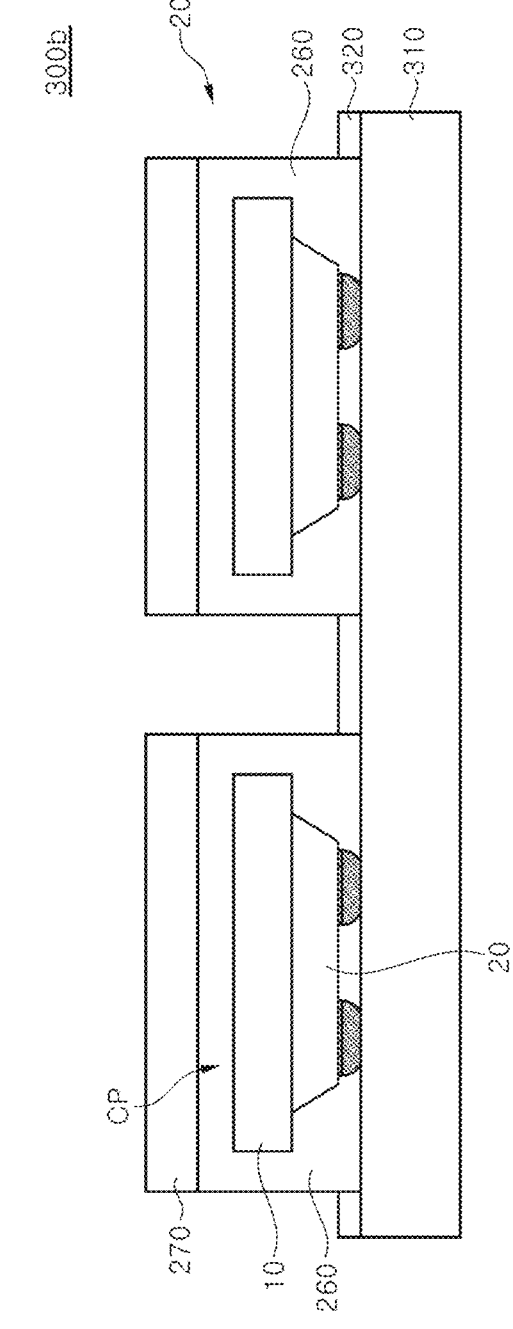

[FIG. 15A]
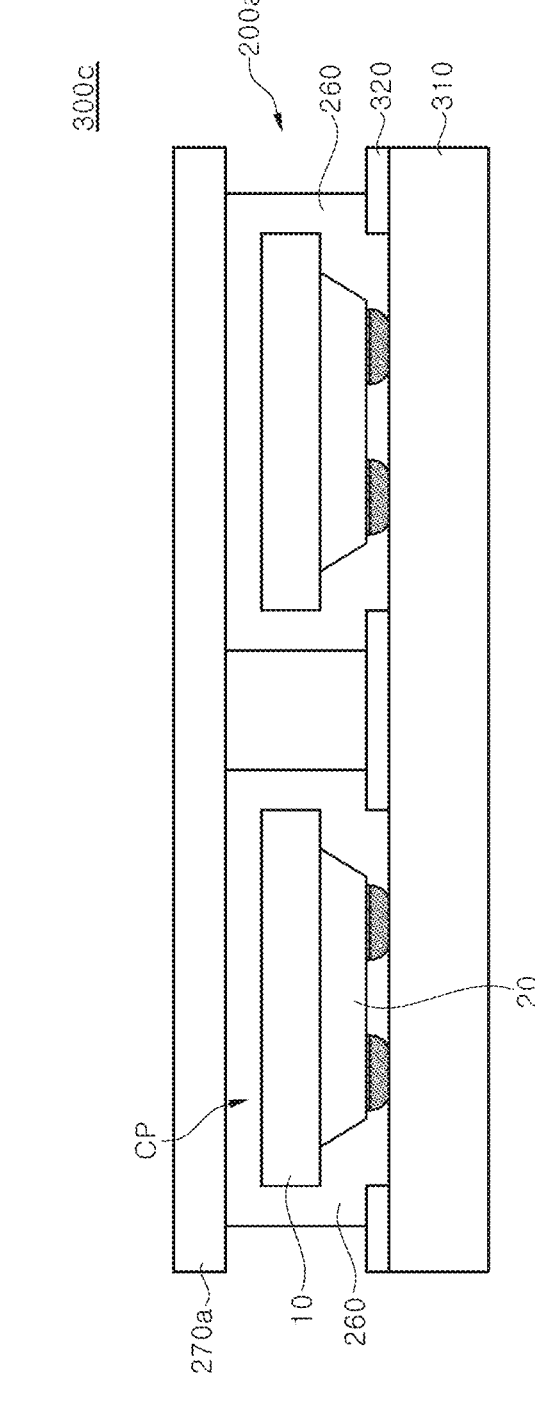

[FIG. 15B]
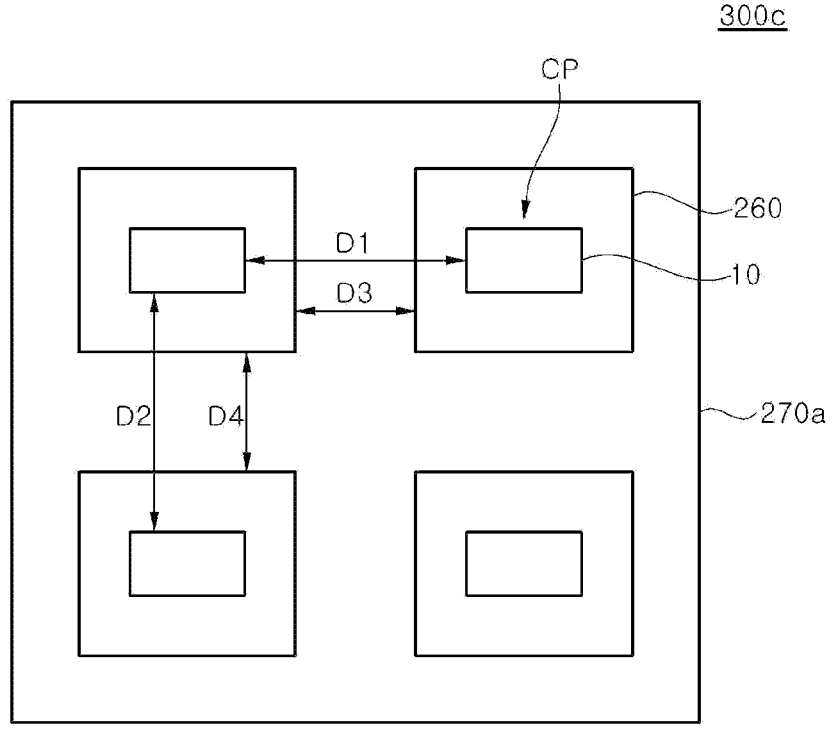
[FIG. 16]
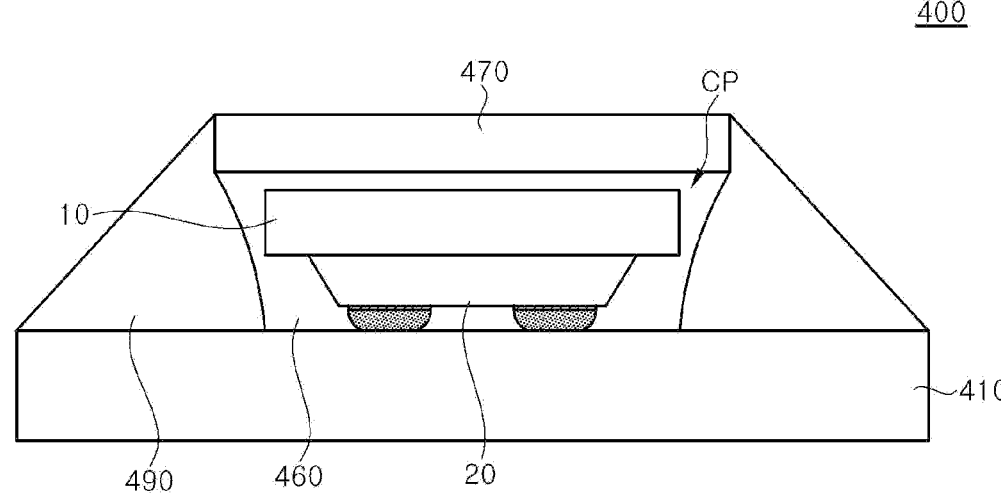

[FIG. 17]
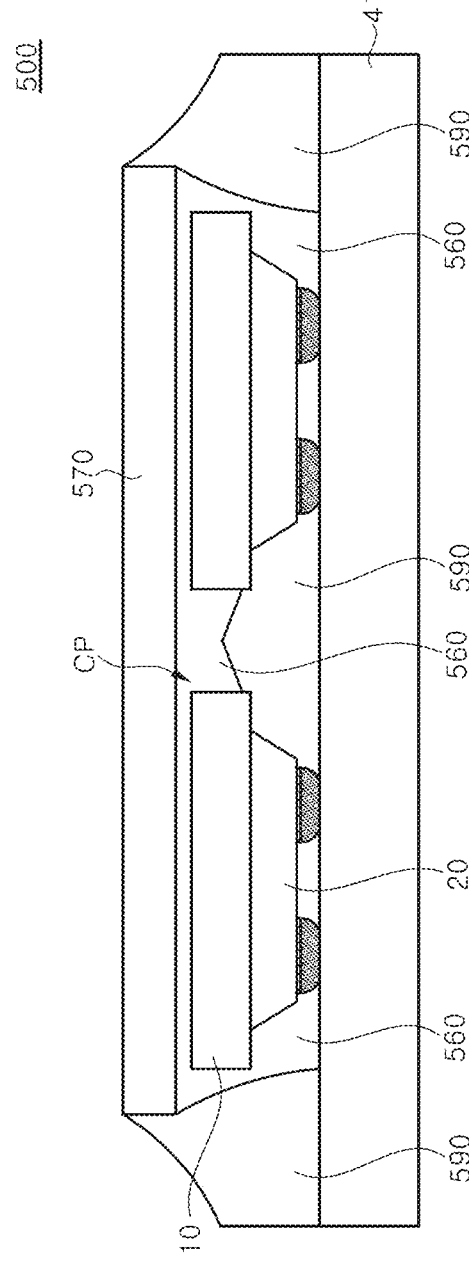

LIGHT EMITTING DEVICE AND PRODUCT INCLUDING SAME

This patent document is a 371 National Phase Application of International Patent Application No. PCT/KR2021/008582, filed Jul. 6, 2021, which further claims priority to and benefits of Korean Patent Application No. 10-2020-0083114, filed Jul. 6, 2020, and Korean Patent Application No. 10-2021-0088109, filed Jul. 5, 2021. The entire contents of the above noted applications are incorporated by reference as part of the disclosure of this document.

TECHNICAL FIELD

The present disclosure relates to a light emitting apparatus and a product including the same.

BACKGROUND ART

As one of self-emitting light sources, a light emitting diode (LED: Light Emitting Diodes) has been widely used recently. The Light emitting diode converts electrical signals into light forms such as infrared, visible, and ultraviolet light by using characteristics of a compound semiconductor. As luminous efficiency of the light emitting diode increases, a light emitting device has been applied to various fields including displays and lighting apparatuses.

Recently, in order to increase the luminous efficiency of the light emitting diode, phosphors are increasingly employed in apparatuses using the light emitting diode. However, when phosphors are weak to water, there is a drawback that the reliability of apparatus using the light emitting diode is lowered.

DISCLOSURE

Technical Problem

Exemplary embodiments provide a light emitting apparatus having improved reliability with a reduced defect rate and a product including the same.

Technical Solution

A light emitting apparatus according to an exemplary embodiment of the present disclosure includes a substrate, a light emitting stack structure disposed on a first region of the substrate, first and second electrodes provided on the light emitting stack structure, first and second bumps provided on the first and second electrodes, respectively, a passivation layer provided on the substrate to expose portions of upper surfaces of the first and second bumps, covering an exposed upper surface of the substrate, and covering the stack structure, a first insulation layer provided between the light emitting stack structure and the passivation layer and including a material different from that of the passivation layer, and a light conversion layer covering a rear surface of the substrate, a side surface of the substrate, and a side surface of the passivation layer and including fluorine, in which the side surface of the substrate is positioned on a same plane as that of the side surface of the passivation layer.

In an exemplary embodiment of the present disclosure, a first insulation layer provided between the light emitting stack structure and the passivation layer is further included, in which the first insulation layer is disposed between the light emitting stack structure and the first electrode, and between the light emitting stack structure and the second electrode, and extends outward from a side surface of the light emitting stack structure and covers a portion of the upper surface of the substrate.

In an exemplary embodiment of the present disclosure, a second insulation layer provided between the first insulation layer and the passivation layer and having first and second through holes exposing portions of upper surfaces of the first and second electrodes is further included, in which the first and second bumps may cover portions of the first and second electrodes around the first and second through holes, respectively.

In an exemplary embodiment of the present disclosure, the second insulation layer may extend outward from the side surface of the light emitting stack structure, and cover an end portion of the first insulation layer and a portion of the upper surface of the substrate.

In an exemplary embodiment of the present disclosure, the passivation layer may cover an end portion of the second insulation layer positioned on the substrate.

In an exemplary embodiment of the present disclosure, a distance between the end portion of the second insulation layer positioned on the substrate and the side surface of the passivation layer may be 10 micrometers or more.

In an exemplary embodiment of the present disclosure, the first and second bumps may have side surfaces inclined with respect to the upper surfaces of the first and second electrodes.

In an exemplary embodiment of the present disclosure, the upper surfaces of the first and second bumps may be positioned on a same plane as that of an upper surface of the passivation layer.

In an exemplary embodiment of the present disclosure, the upper surfaces of the first and second bumps may be provided at positions close to the light emitting stack from the upper surface of the passivation layer.

In an exemplary embodiment of the present disclosure, the passivation layer may be made of a transparent moisture resistant material.

In an exemplary embodiment of the present disclosure, the light conversion layer may include a phosphor that converts at least a portion of light emitted from the light emitting stack structure into light of a different wavelength.

In an exemplary embodiment of the present disclosure, the phosphor is at least one of a green phosphor or a yellow phosphor; and a red phosphor.

In an exemplary embodiment of the present disclosure, the red phosphor layer provided on the rear surface of the substrate is further included, and the phosphor provided in the light conversion layer may be at least one of the green phosphor or the yellow phosphor.

In an exemplary embodiment of the present disclosure, a protection layer provided on an outer surface of the light conversion layer may be further included.

In an exemplary embodiment of the present disclosure, the protection layer is made of silicone, and may optionally include a glass filler.

A product according to an exemplary embodiment of the present disclosure includes a device substrate: light emitting devices disposed on the device substrate; passivation layers covering each of the light emitting devices; and a light conversion layer covering the passivation layers and including fluorine.

Each of the light emitting devices may include a substrate; a light emitting stack structure disposed on a first region of the substrate; first and second electrodes provided on the light emitting stack structure; first and second bumps provided on the first and second electrodes, respectively; and a first insulation layer provided between the light emitting stack structure and the passivation layer, in which the light emitting device may be mounted on the device substrate through the first and second bumps.

A portion of the passivation layer may be disposed between the light conversion layer and the substrate.

The product may further include a light reflection layer disposed on the device substrate.

The passivation layer may cover a portion of the light reflection layer.

A light emitting apparatus according to an exemplary embodiment of the present disclosure may be manufactured by steps of preparing a light emitting stack structure disposed on a substrate, forming first and second electrodes on the light emitting stack structure, forming first and second bumps on the light emitting stack structure, forming a passivation layer covering at least portions of the light emitting stack structure and the first and second bumps, cutting the substrate and the passivation layer in a single process such that a side surface of the substrate and a side surface of the passivation layer are on a same plane, and forming a light conversion layer on an outer surface of the passivation layer.

In an exemplary embodiment of the present disclosure, the step of forming of the passivation layer may include a step of grinding the passivation layer so as to expose upper surfaces of the first and second bumps after forming the passivation layer on the light emitting stack structure such that the first and first bumps are covered.

In an exemplary embodiment of the present disclosure, the step of forming the passivation layer may include a step of forming first and second bump holes so as to expose the upper surfaces of the first and second bumps by a photo process using a mask after forming the passivation layer including a photosensitive material on the light emitting stack structure such that the first and second bumps are covered.

In an exemplary embodiment of the present disclosure, the first and second bumps may be formed by dotting and reflowing a solder paste on the first and second electrodes.

In an exemplary embodiment of the present disclosure, the light conversion layer may be formed by curing after coating a light conversion layer material such that a rear surface and a side surface of the substrate and a side surface of the passivation layer are covered.

Advantageous Effects

According to an exemplary embodiment of the present disclosure, a light emitting apparatus having improved reliability by reducing failures and a product including the same are provided.

DESCRIPTION OF DRAWINGS

FIG. 1A is a schematic perspective view illustrating a light emitting apparatus according to an exemplary embodiment of the present disclosure, and FIG. 1B is an inverted version of FIG. 1A, which is a cross-sectional view of the light emitting apparatus of FIG. 1A taken along line A-A'.

FIG. 2 is a cross-sectional view showing an exemplary embodiment of the light emitting apparatus shown in FIG. 1A and FIG. 1B in more detail.

FIG. 3 is a schematic cross-sectional view illustrating a light emitting apparatus according to an exemplary embodiment of the present disclosure.

FIG. 4 is a schematic cross-sectional view illustrating a light emitting apparatus according to an exemplary embodiment of the present disclosure.

FIGS. 5A through 5H are schematic cross-sectional views illustrating a method of manufacturing a light emitting apparatus according to an exemplary embodiment of the present disclosure.

FIG. 6 is a schematic cross-sectional view illustrating a light emitting apparatus manufactured using a photolithography process.

FIGS. 7A and 7B are schematic cross-sectional views illustrating a method of manufacturing the light emitting apparatus of FIG. 6.

FIG. 8 is a schematic cross-sectional view illustrating a light emitting apparatus according to an exemplary embodiment of the present disclosure.

FIG. 9 is a schematic cross-sectional view illustrating a light emitting apparatus according to an exemplary embodiment of the present disclosure.

FIG. 10 is a schematic cross-sectional view illustrating a light emitting apparatus according to an exemplary embodiment of the present disclosure.

FIG. 11 is a schematic cross-sectional view illustrating a light emitting apparatus according to an exemplary embodiment of the present disclosure.

FIG. 12 is a schematic cross-sectional view illustrating a light emitting apparatus according to an exemplary embodiment of the present disclosure.

FIG. 13 is a schematic cross-sectional view illustrating a product including a light emitting apparatus according to an exemplary embodiment of the present disclosure.

FIG. 14 is a schematic cross-sectional view illustrating a product including a light emitting apparatus according to an exemplary embodiment of the present disclosure.

FIG. 15A is a schematic cross-sectional view illustrating a product including a light emitting apparatus according to an exemplary embodiment of the present disclosure.

FIG. 15B is a schematic plan view illustrating a product including a light emitting apparatus according to an exemplary embodiment of the present disclosure.

FIG. 16 is a schematic cross-sectional view illustrating a light emitting apparatus according to an exemplary embodiment of the present disclosure.

FIG. 17 is a schematic cross-sectional view illustrating a light emitting apparatus according to an exemplary embodiment of the present disclosure.

BEST MODE

Since the present invention may have various changes and various shapes, specific embodiments are illustrated in the drawings and described in detail in the disclosure. However, it should be understood that this is not intended to limit the present invention to the specific disclosed shape, and includes all modifications, equivalents, and substitutes included in the spirit and scope of the present invention.

Hereinafter, preferred embodiments of the present invention will be described in more detail with reference to the accompanying drawings.

The present invention relates to a light emitting apparatus, and more particularly, to a light emitting diode used in a display apparatus, a lighting apparatus, an image reading apparatus, and the like. The display apparatus includes a television, a tablet, an e-book display apparatus, a computer monitor, a kiosk, a digital camera, a game console, a large outdoor/indoor signboard, and the like. The lighting apparatus includes home lighting, medical lighting, industrial lighting, and the like. The Image reading apparatus includes a copier, a facsimile, a scanner, and the like.

FIG. 1A is a perspective view showing a light emitting apparatus 100 according to an exemplary embodiment of the present disclosure, and FIG. 1B is an inverted version of FIG. 1A, which is a cross-sectional view of the light emitting apparatus of FIG. 1A taken along line A-A'.

Referring to FIGS. 1A and 1B, the light emitting apparatus 100 may be provided in a substantially rectangular parallelepiped shape, and in an exemplary embodiment, it may be provided in a rectangular parallelepiped shape elongated in one direction. In this exemplary embodiment, a longitudinal direction of the light emitting apparatus 100 is indicated as a first direction D1, a width direction perpendicular to the longitudinal direction is indicated as a second direction D2, and a direction perpendicular to a plane formed by the first direction D1 and the second direction D2 (in the drawing, a direction opposite to a direction in which light is emitted) is indicated as a third direction D3. In an exemplary embodiment of the present disclosure, terms indicating specific directions or positions including the first through third directions (e.g., "upper", "lower", "left", "right" and other terms including these) are for convenience of description, and a technical scope of inventive concepts are not limited by the meaning of these terms. In addition, hereinafter, like numbers denote identical components, and similar numbers denote similar components.

In an exemplary embodiment of the present disclosure, an overall shape of the light emitting apparatus 100 is presented as the substantially rectangular parallelepiped, but the inventive concepts are not limited thereto. For example, a surface from which light is emitted is illustrated as having a rectangular shape, but it does not have to be the rectangular shape, and may be provided in other shapes without departing from the concept of the present invention which will be described later.

In an exemplary embodiment of the present disclosure, a light exiting direction is shown as an upward direction, but the light exiting direction may vary depending on a mounting direction of the light emitting apparatus 100 to other devices, and is not limited to a specific direction.

In an exemplary embodiment of the present disclosure, when molding, solidification, curing, processing, modification, or others are performed on materials used in manufacturing the light emitting apparatus, regardless of before and after these processes, same names will be used unless additional explanation is required. For example, a same name can be used even when it is in a liquid or paste before molding, but becomes a solid after molding, or it is processed with additional grinding after becoming solid. In addition, even when a metallic layer is formed and a predetermined configuration is formed by patterning the metallic layer, a same name can be used in a same manner.

The light emitting apparatus 100 according to an exemplary embodiment of the present disclosure is a light emitting diode chip, which is mounted on a device substrate afterward. A light emitting device CP may be provided in a flip chip shape and mounted on the device substrate with a conductive adhesive member interposed therebetween. In an exemplary embodiment of the present disclosure, a type of light emitting device CP is not limited thereto, and may be provided in various shapes such as a lateral type or a vertical type, without departing from the concept of the present invention.

In an exemplary embodiment of the present disclosure, the light emitting apparatus 100 includes the light emitting device CP that emits light, a passivation layer 60 covering at least a portion of the light emitting device CP, and a light conversion layer 70 disposed outside of the passivation layer 60.

The light emitting device CP may have a shape similar to the overall shape of the light emitting apparatus 100 and may elongate in the first direction D1 similar to the shape of the light emitting apparatus 100. Accordingly, when facing the surface from which light is emitted, each light emitting device CP is provided in a rectangular shape having a pair of long sides and a pair of short sides. When the long sides are referred to as first sides and the short sides as second sides, the first sides extend in the first direction D1 and the second sides extend in the second direction D2. However, the inventive concepts are not limited thereto, and the light emitting device CP may not have the shape similar to the overall shape of the light emitting apparatus 100.

The light emitting device CP may include a substrate 10, a light emitting stack structure 20, and an electrode portion. The light emitting stack structure 20 may include a first semiconductor layer 21, an active layer 23, and a second semiconductor layer 25, and the electrode portion may include first and second electrodes 31 and 33, and first and second bumps 41 and 43 formed on the first and second electrodes 31 and 33. In an exemplary embodiment of the present disclosure, a contact electrode 25p may be provided between the second semiconductor layer 25 and the second electrode 33.

The light emitting stack structure 20 may be provided on a first region R1 of the substrate 10. When a region other than the first region where the light emitting stack structure 20 is not provided is referred to as a second region R2, an upper surface of the substrate 10 is exposed to the outside in the second region R2. The substrate 10 may be a growth substrate such as sapphire or may be an additionally provided substrate unlike the growth substrate. The substrate 10 may be a substrate having a pattern formed thereon. The substrate 10 may be made of, for example, sapphire, gallium nitride, gallium arsenide, gallium phosphorus, aluminum nitride, silicon, silicon carbide, indium phosphorus, zinc sulfide, zinc oxide, zinc selenide, diamond, or the like, and the inventive concepts are not limited thereto. The substrate 10 is preferably an insulating substrate, but is not limited to the insulating substrate, and may be omitted if necessary.

In an exemplary embodiment of the present disclosure, the first and second electrodes 31 and 33 are provided on the light emitting stack structure 20. A connection relationship between the light emitting stack structure 20 and the first and second electrodes 31 and 33 will be described in detail in an exemplary embodiment which will be described later.

The first and second electrodes 31 and 33 may be made of a conductive material. The first and second electrodes 31 and 33 may be made of various materials exhibiting conductivity, and for example, they may include at least one of various metals such as Al, Ti, Cr, Ni, Au, Ag, Cr, Cu, Ti, Ru, Rh, Ir, Mg, Zn, Al, In, Ta, Pd, and Co, and alloys thereof, or at least one combination among these.

The first and second bumps 41 and 43 are provided on the first and second electrodes 31 and 33, respectively. At least portions of upper surfaces of the first and second bumps 41 and 43 are exposed to the outside such that the light emitting device CP is connected afterward to a device substrate (e.g., a printed circuit board).

The first and second bumps 41 and 43 are provided in a pair so as to correspond to the first and second electrodes 31 and 33, respectively, and to be electrically connected thereto. The first and second bumps 41 and 43 may be provided with metallic paste. The metallic paste may include at least one metallic powder selected from a group consisting of gold, silver, copper, iron, nickel, aluminum, chromium, titanium, palladium, tungsten, rhodium, and alloys thereof, and a resin binder, or may include lead-containing solder alloys, such as Sn—Pb or Sn—Pb—Ag-based alloys, or lead-free solder alloys, such as Sn—Ag-based alloys, Sn—Bi-based alloys, Sn—Zn-based alloys, Sn—Sb-based or Sn—Ag—Cu based alloys.

The passivation layer 60 is provided on the substrate 10 to expose the portions of upper surfaces of the first and second bumps 41 and 43 and to cover the light emitting stack structure 20. That is, the passivation layer 60 covers the light emitting stack structure 20 in the first region R1 and covers the exposed upper surface of the substrate 10 in the second region R2. The passivation layer 60 prevents moisture from the outside, and by-products generated by reacting with moisture from the outside, such as materials constituting the light conversion layer 70 from infiltrating into the light emitting device CP. In an exemplary embodiment, the passivation layer 60 may be formed of a material different from those of the first and second insulation layers 51 and 53 which will be described later. For example, the passivation layer 60 may be made of a moisture resistant material, for example, a material having hydrophobicity. The moisture resistant material may be polyimide. Since the polyimide has low water permeability and is resistant to thermal stress or mechanical stress, when the passivation layer 60 is formed of polyimide, the light emitting device CP therein may be effectively protected. In an exemplary embodiment of the present disclosure, the polyimide may be used regardless of photosensitive polyimide (PSPI) or non-photosensitive polyimide (PI).

In an exemplary embodiment of the present disclosure, the passivation layer 60 may be made of a transparent material, for example, a transparent polymer resin, so as not to block light emitted from the light emitting stack structure 20 to proceed outward. However, the passivation layer 60 does not necessarily have to be transparent, and may be made of a translucent or opaque material if necessary. Alternatively, particles for reflection may be additionally included in the passivation layer 60. For example, fine particles made of aluminum oxide, titanium oxide, zinc oxide, magnesium oxide, magnesium carbonate, magnesium hydroxide, calcium carbonate, calcium hydroxide, silicon calcium, silicon magnesium, barium titanate, barium sulfate, zirconium oxide, or the like may be included in the polyimide. Alternatively, the polyimide may include a combination of fine particles in which at least one or more of the materials are combined. In addition, the passivation layer 60 may include a material such as $SiO_2$, SiN, or silicone resin. In another exemplary embodiment, the passivation layer 60 may be formed of a same material as that of a first insulation layer 51 or a second insulation layer 53 described below.

The passivation layer 60 covers the light emitting device CP such that moisture or a by-product reacted with moisture does not infiltrate into the light emitting device CP as much as possible.

In an exemplary embodiment of the present disclosure, the passivation layer 60 is provided on the substrate 10, and may cover all of the upper surface except for a side surface of the light emitting stack structure 20, and a region where the first and second bumps 41 and 43 are provided. The passivation layer 60 may also directly contact the substrate 10 in a region surrounding a region where the light emitting device CP is formed. Accordingly, infiltration of moisture from the outside or by-products reacted with moisture into the light emitting device CP is minimized.

In an exemplary embodiment of the present disclosure, a side surface of the substrate 10 and a side surface of the passivation layer 60 are positioned on a same plane. This is due to cutting the passivation layer 60 after forming the passivation layer 60 before forming the light conversion layer 70 so as to protect the light emitting device CP, which will be described later. This will be described later. However, the inventive concepts are not limited thereto and various modifications are possible.

In an exemplary embodiment of the present disclosure, the light conversion layer 70 covers a rear surface of the substrate 10, the side surface of the substrate 10, and the side surface of the passivation layer 60.

The light conversion layer 70 includes a light conversion material capable of converting light while effectively covering the light emitting device CP. For example, the light conversion layer 70 may include a polymer resin so as to effectively cover a light emitting layer. When the light conversion layer 70 includes the polymer resin, a resin material in an uncured or semi-cured state is provided to the light emitting device CP, and thus, the light emitting device CP can be easily manufactured by covering both the light emitting device CP and a light transmitting portion, curing them, and cutting them afterward. The resin material in the uncured or semi-cured state may be provided by various methods such as injection molding, extrusion molding, transfer molding, or others.

In an exemplary embodiment of the present disclosure, for the polymer resin constituting the light conversion layer 70, an epoxy resin, a phenol resin, a polycarbonate resin, a silicone resin, an acrylic resin, or modified resins thereof may be used. In an exemplary embodiment of the present disclosure, the polymer resin may be silicone or modified silicone resin, such as a dimethyl silicone resin, a phenyl-methyl silicone resin, a diphenyl silicone resin, or the like. Silicone or modified silicone resin has favorable heat resistance and less deformation by light.

The light conversion layer 70 includes a light conversion material that converts at least a portion of light emitted from the light emitting stack structure 20 into light of a different wavelength. The light conversion material converts light of a predetermined wavelength (first wavelength) into light of a different wavelength (second wavelength) from an original wavelength. The first wavelength is shorter than the second wavelength. The light conversion material may, for example, convert ultraviolet light into visible light or convert blue wavelength light into red wavelength light. The light transmitting portion may be provided with one or more types of light conversion materials, and depending on the type of the light conversion material, it is possible to convert light emitted from the light emitting device CP into various types of light different from those emitted from the light emitting device CP.

In an exemplary embodiment of the present disclosure, the light conversion layer 70 may include a phosphor.

For example, as a phosphor that emits light in a green wavelength band, a yttrium•aluminum•garnet-based phosphor (e.g., $Y_3(Al, Ga)_5O_{12}:Ce$), a lutetium•aluminum•garnet-based phosphor (e.g., $Lu_3(Al, Ga)_5O_{12}:Ce$), a terbium•aluminum•garnet-based phosphor (e.g., $Tb_3(Al, Ga)_5O_{12}:Ce$), a silicate-based phosphor (e.g., $(Ba, Sr)_2SiO_4:Eu$), a chlorosilicate-based phosphor (e.g., $CasMg (SiO_4)_4Cl_2:Eu$), a β sialon-based phosphor (e.g., $Si_{6-z}Al_zO_zN_{8-z}:Eu(0<z<4.2)$), a SGS-based phosphor (e.g., $SrGa_2S_4:Eu$), and the like may be included. As a phosphor of yellow light, a sialon-based phosphor (e.g., $M_z(Si, Al)_{12}$ $(O, N)_{16}$ (wherein, $0<z\leq2$, and M is a lanthanum element excluding Li, Mg, Ca, Y, and La and Ce) and the like may be included.

In addition, among the phosphors emitting light in the green wavelength region, a phosphor emitting yellow wavelength region is also included. In addition, in the yttrium•aluminum•garnet-based phosphor, for example, an emission peak wavelength may be shifted to a longer wavelength side by substituting a portion of Y with Gd, and thus, emission in the yellow wavelength region is possible. In addition, among them, there is also a phosphor capable of emitting light in a main yellow wavelength region.

As a phosphor that emits light in a red wavelength region, a nitrogen-containing aluminosilicon calcium (CASN or SCASN)-based phosphor (e.g., (Sr, Ca)AlSiN$_3$:Eu) and the like may be included. In addition, there is a manganese-activated fluoride-based phosphor (a phosphor represented by a general formula (I) A$_2$[M$_{1-a}$Mn$_a$F$_6$]). In the general formula (I), A is at least one element selected from a group consisting of K, Li, Na, Rb, Cs, and NH$_4$, M is at least one element selected from a group consisting of Group 4 elements and Group 14 elements, and "a" satisfies $0<a<0.2$. A representative example of the manganese-activated fluoride-based phosphor is a phosphor of manganese-activated potassium fluoride silicon (e.g., K$_2$SiF$_6$:Mn). In addition, there is a manganese-activated phosphor based on an oxiodohalide host lattice (phosphor represented by a general formula (II) (A$_{4-a}$B$_a$)$_{m/2+n/2}$X$_{2m}$[MX$_4$O$_2$]$_n$). In the general formula (II), A is hydrogen (H) and/or deuterium (D), and B is Li, Na, K, Rb, Cs, NH4, ND4, and/or NR4, wherein R is an alkyl or aryl radical, X is F and/or Cl, M is Cr, Mo, W and/or Re, $0\leq a\leq4$, $0<m\leq10$, and $1\leq n\leq10$.

In an exemplary embodiment of the present disclosure, the phosphor may include at least one of the green phosphor or the yellow phosphor, and the red phosphor.

According to an exemplary embodiment of the present disclosure, the phosphor may include one containing fluorine-based molecules as the red phosphor. In an exemplary embodiment of the present disclosure, specifically, the manganese-activated potassium fluoride silicon-based phosphor or the manganese-activated phosphor based on the oxidohalide host lattice may be included as the red phosphor. In a case of the manganese-activated potassium fluoride silicon-based phosphor, two peaks exhibiting colors are provided, and accordingly, it has an advantage that a color gamut is high. Herein, the manganese-activated potassium fluoride silicon-based phosphor (referred to as KSF phosphor) can emit red color in a region of about 630 nm by doping with manganese tetravalent ions.

However, the red phosphor such as KSF phosphor or the like is very sensitive to moisture, and specifically, may react with external moisture to form HF. Accordingly, when moisture infiltrates into the light conversion layer 70, HF with a very high acidity is generated by reacting the moisture with Fluorine of the KSF phosphor, and when the generated HF infiltrates into the inside, it causes a drawback of reducing a durability of the light emitting device CP itself, such as corrosion of metal-related components of the light emitting device CP. In particular, when the light emitting apparatus 100 is formed on a chip scale without an additional package, reliability may decrease due to this phenomenon.

In an exemplary embodiment of the present disclosure, to prevent moisture from the outside and by-products generated by reacting with moisture from the outside, for example, a material such as HF, from infiltrating into the light emitting device CP, the passivation layer 60 is formed as described above. Accordingly, a defect of the light emitting device CP, in particular, corrosion of the first and second electrodes 31 and 33 including metallic materials disposed in the light emitting device CP may be prevented.

The passivation layer 60 may be disposed in various forms on a path through which by-products may infiltrate from the light conversion layer 70 into the light emitting device CP so as to prevent the by-products from infiltrating into the light emitting device CP from the light conversion layer 70.

The light conversion layer 70 may be formed as a single layer in which a light conversion material is dispersed, but the inventive concepts are not limited thereto. For example, the light conversion layer 70 may be formed of a plurality of layers having different densities of light conversion materials or a plurality of layers having different dispersed light conversion materials. For example, the light conversion layer 70 may include a plurality of layers having different target wavelengths. For example, the light conversion layer 70 may include a first layer including the green phosphor and a second layer including the red phosphor. The light conversion layer 70 may be formed of a plurality of layers using, for example, a double molding technique.

The light emitting apparatus 100 having the above-described structure has an effect of significantly reducing or preventing defects of the light emitting apparatus due to moisture and by-products of materials reacted with moisture.

FIG. 2 is a cross-sectional view showing an exemplary embodiment of the light emitting apparatus 100 shown in FIGS. 1A and 1B in more detail. In the following embodiments, differences from the above-described embodiments will be mainly described so as to avoid duplication of description, and the above-described embodiments may be applied to parts that are not described.

Referring to FIG. 2, the light emitting stack structure 20 includes the first and second semiconductor layers 21 and 25 having impurities of different conductivity types, and the active layer 23 provided between the first and second semiconductor layers 21 and 25.

The first semiconductor layer 21 is provided on the substrate 10.

The substrate 10 may be a growth substrate such as a sapphire substrate.

The first semiconductor layer 21 is a semiconductor layer doped with a first conductivity type dopant. The first conductivity type dopant may be an n-type dopant. The first conductivity type dopant may be Si, Ge, Se, Te or C. In an exemplary embodiment of the present disclosure, the first semiconductor layer 21 may include a nitride-based semiconductor material. For example, the first semiconductor layer 21 may be formed of a semiconductor material having a composition formula of InxAlyGa1−x−yN ($0\leq x\leq1$, $0\leq y\leq1$, $0\leq x$ $y\leq1$). In an exemplary embodiment of the present disclosure, the semiconductor material having the above composition formula may include GaN, AlN, AlGaN, InGaN, InN, InAlGaN, AlInN, and the like. The first semiconductor layer 21 may be formed by growing the semiconductor material so as to include the n-type dopant such as Si, Ge, Sn, Se, or Te.

The active layer 23 is provided on the first semiconductor layer 21 and corresponds to a light emitting layer.

The active layer 23 is a layer in which electrons (or holes) injected through a first conductivity type semiconductor layer and holes (or electrons) injected through the second semiconductor layer 25 meet one another, and emits light due to a difference in band gaps of energy bands depending on materials for forming the active layer 23. The active layer 23 may emit light with a peak wavelength of at least one of ultraviolet, blue, green, and red.

The active layer 23 may be implemented as a compound semiconductor. The active layer 23 may be implemented with, for example, at least one of compound semiconductors of group 3-5 or group 2-6, and may be formed of a material having a composition formula of $InxAlyGa1-x-yN$ ($0\leq x\leq 1$, $0\leq y\leq 1$, $0\leq x$ $y\leq 1$).

The second semiconductor layer 25 is provided on the active layer 23.

The second semiconductor layer 25 is a semiconductor layer having a second conductivity type dopant having a polarity opposite to that of the first conductivity type dopant. The second conductivity type dopant may be a p-type dopant, and the second conductivity type dopant may include, for example, Mg, Zn, Ca, Sr, Ba, or the like. In an exemplary embodiment of the present disclosure, the second semiconductor layer 25 may include a nitride-based semiconductor material. The second semiconductor layer 25 may be made of a semiconductor material having a composition formula of $InxAlyGa1-x-yN$ ($0\leq x\leq 1$, $0\leq y\leq 1$, $0\leq x$ $y\leq 1$). In an exemplary embodiment of the present disclosure, semiconductor materials having the above composition formula may include GaN, AlN, AlGaN, InGaN, InN, InAlGaN, AlInN, and the like. The second semiconductor layer 25 may be formed by growing the semiconductor material so as to include the p-type dopant such as Mg, Zn, Ca, Sr, Ba, or the like.

In an exemplary embodiment of the present disclosure, the contact electrode 25p provided between the second semiconductor layer 25 and the second electrode 33 may be a p-type contact electrode for improving contact characteristics between the second semiconductor layer 25 doped with a p-type impurity and the second electrode 33. The contact electrode 25p may be made of a metal such as transparent conductive oxide (TCO) or silver. The transparent conductive oxide may include tin oxide (SnO), indium oxide ($InO_2$), zinc oxide (ZnO), indium tin oxide (ITO), indium tin zinc oxide (ITZO), and the like.

In an exemplary embodiment of the present disclosure, various components may be further included in addition to the substrate 10, the light emitting stack structure 20, and the electrode portion. An insulation layer covering the light emitting stack structure 20 may be provided on the upper surface and the side surfaces of the light emitting stack structure 20. The insulation layer may be at least one oxide or nitride selected from a group consisting of silicon, titanium, zirconium, niobium, tantalum, and aluminum, but the inventive concepts are not limited thereto. In a specific embodiment, the insulation layer may include a distributed Bragg reflector in which layers having different refractive indices are alternately stacked.

The insulation layer includes the first insulation layer 51 covering the upper surface and the side surfaces of the light emitting stack structure 20, and the second insulation layer 53 provided on the first insulation layer 51 and covering the upper and the side surfaces of the light emitting stack structure 20. The first insulation layer 51 and/or the second insulation layer 53 may be formed as a single layer, without being limited thereto, and may be formed as multiple layers. In addition, the first insulation layer 51 and/or the second insulation layer may include a distributed Bragg reflector.

The first and second electrodes 31 and 33 are provided on the first insulation layer 51. In other words, the first insulation layer 51 is disposed between the light emitting stack structure 20 and the first electrode 31, and between the light emitting stack structure 20 and the second electrode 33. The first insulation layer 51 has a first contact hole CH1 and a second contact hole CH2 exposing the upper surface or a portion of the side surface of the light emitting stack structure 20. The first electrode 31 and the second electrode 33 are electrically connected to the light emitting stack structure 20 through the first contact hole CH1 and the second contact hole CH2, respectively. In detail, the first contact hole CH1 exposes a portion of an upper surface or a side surface of he first semiconductor layer 21 among the light emitting stack structure 20, and the second contact hole CH2 exposes a portion of an upper surface or a side surface of the second semiconductor layer 25 among the light emitting stack structure 20. The first electrode 31 is connected to the first semiconductor layer 21 through the first contact hole CH1, and the second electrode 33 is connected to the second semiconductor layer 25 through the second contact hole CH2. In an exemplary embodiment of the present disclosure, each of the first and second contact holes CH1 and CH2 is shown as one in the drawing, but may be provided in plurality.

The first insulation layer 51 may extend outward from the side surface of the light emitting stack structure 20 to cover a portion of the upper surface of the substrate 10. The second insulation layer 53 is provided on the first insulation layer 51 on which the first and second electrodes 31 and 33 are formed. The second insulation layer 53 has first and second through holes TH1 and TH2 exposing portions of the upper surfaces of the first and second electrodes 31 and 33. The first electrode 31 and the second electrode 33 are connected to the first bump 41 and the second bump 43 through the first through hole TH1 and the second through hole TH2, respectively. In detail, the first through hole TH1 exposes the portion of the upper surface of the first electrode 31, and the second through hole TH2 exposes the portion of the upper surface of the second electrode 33.

The second insulation layer 53 may extend outward from the side surface of the light emitting stack structure 20 to cover a portion of the upper surface of the substrate 10. In particular, the second insulation layer 53 may cover an end portion of the first insulation layer 51.

The first and second bumps 41 and 43 are provided in regions where the first and second through holes TH1 and TH2 are formed, respectively. The first and second bumps 41 and 43 cover the exposed upper surfaces of the first and second electrodes 31 and 33 around the first and second through holes TH1 and TH2, respectively. In addition to this, the passivation layer 60 covers an end portion of the second insulation layer 53 positioned on the substrate 10, and in detail, covers a portion of the second insulation layer 53 where the first and second through holes TH1 and TH2 are formed. Since the first and second bumps 41 and 43 cover the end portion of the second insulation layer 53, there is an effect that cracks in the light emitting device and the first and second insulation layers 51 and 53 on the upper surface thereof are alleviated. Furthermore, the first and second bumps 41 and 43 may prevent impurities from the outside from infiltrating directly into the first electrode 31 or the second electrode 33, through contacting an upper portion of the second insulation layer 53.

In an exemplary embodiment of the present disclosure, each of the first and second bumps 41 and 43 may have a side surface inclined with respect to the upper surfaces of the first and second electrodes 31 and 33. Since the first and second bumps 41 and 43 have the side surfaces inclined with respect to the surfaces of the first and second electrodes 31 and 33, resistance to external force may be improved.

The passivation layer 60 is provided on an outer side of the light emitting stack structure 20 on which the first and second insulation layers 51 and 53 and the first and second bumps 41 and 43 are formed. The passivation layer 60 is to prevent moisture from the outside and by-products generated by reacting with moisture from the outside, for example, a material such as the HF, from infiltrating into the light emitting device, and in addition to the first and second insulation layers 51 and 53, the passivation layer 60 more effectively blocks the infiltration of moisture and by-products that cannot be blocked by the first and second insulation layers 51 and 53.

In an exemplary embodiment of the present disclosure, a distance D between the end portion of the second insulation layer 53 positioned on the substrate 10 and the side surface of the passivation layer 60 may be more than a predetermined value. The predetermined distance may be set to a value at which the passivation layer 60 can prevent infiltration of moisture and by-products caused by moisture, and the distance may be, for example, 10 micrometers or more.

In an exemplary embodiment of the present disclosure, the upper surfaces of the first and second bumps 41 and 43 may be disposed on a same plane as that of the upper surface of the passivation layer 60.

In an exemplary embodiment of the present disclosure, the side surface of the passivation layer 60 and the side surface of the substrate 10 may be disposed on a same plane. However, the inventive concepts are not necessarily limited thereto.

In an exemplary embodiment of the present disclosure, the light conversion layer 70 may include various types of phosphors. In this exemplary embodiment, the light conversion layer 70 may include at least one of the green phosphor or the yellow phosphor, and the red phosphor. That is, according to an exemplary embodiment of the present disclosure, the green phosphor and the red phosphor, the yellow phosphor and the red phosphor, or the green phosphor and the yellow phosphor and the red phosphor may be included. Herein, the red phosphor may be the KSF phosphor.

According to an exemplary embodiment of the present disclosure, in the light conversion layer 70, modifications may be applied in various shapes so as to minimize defects due to by-products by the reaction of moisture and other components with moisture while increasing luminous efficiency.

FIG. 3 is a cross-sectional view showing a light emitting apparatus 100' according to an exemplary embodiment of the present disclosure, in which the light conversion layer 70 is formed differently from the above-described embodiment.

Referring to FIG. 3, the light emitting apparatus 100' includes an additional light conversion layer 70a provided on the rear surface of the substrate 10. The additional light conversion layer 70a may be, for example, a red phosphor layer. Herein, the light conversion layer 70 includes at least one of a green phosphor or a yellow phosphor.

In an exemplary embodiment of the present disclosure, the red phosphor layer may include the KSF phosphor. As described above, since the red phosphor is vulnerable to moisture compared to other phosphors, it is advantageous to be spaced apart from the light emitting stack structure 20 and the electrode portion as much as possible. In this exemplary embodiment, since the red phosphor layer is formed on the rear surface of the substrate 10, a distance between the light emitting stack structure 20 and the first and second electrodes 31 and 33 is large, and a possibility of infiltration of materials included in the red phosphor layer toward the light emitting stack structure 20 may be primarily lowered by the substrate 10.

In an exemplary embodiment of the present disclosure, the light emitting apparatus may further include an additional configuration for improving reliability of the light emitting apparatus.

FIG. 4 shows a light emitting apparatus 100" according to an exemplary embodiment of the present disclosure, which shows an additional component, for example, an additional protection layer 71 for preventing cracks in the light emitting stack structure 20, and the first and second insulation layers 51 and 53 when the light emitting device generates heat.

Referring to FIG. 4, in an exemplary embodiment of the present disclosure, the protection layer 71 may be provided on an outer surface of the light conversion layer 70. The protection layer 71 may be made of a material resistant to internal and external stress and thermal stress. A variety of polymer materials may be used as the material constituting the protection layer 71, and may be made of organic polymer resins such as various epoxy resins and/or silicone resins. In an exemplary embodiment of the present disclosure, a glass filler may be selectively included in the organic polymer resin and/or the silicone resin.

In an exemplary embodiment of the present disclosure, the protection layer 71 may be made of a transparent material such that light emitted from the light emitting stack structure 20 is not blocked.

The light emitting apparatuses 100, 100', and 100" having the above structures may be manufactured by the following method, so that hereinafter, the method of manufacturing the light emitting apparatus shown in FIG. 2 will be mainly described as an example.

The light emitting apparatus 100 may be manufactured by preparing the light emitting stack structure 20 disposed on the substrate 10, forming the first and second electrodes 31 and 33 on the light emitting stack structure 20, forming the first and second bumps 41 and 43 on the light emitting stack structure 20, forming the passivation layer 60 covering at least portions of the light emitting stack structure 20 and the first and second bumps 41 and 43, cutting the substrate 10 and the passivation layer 60 in a single process such that the side surface of the substrate 10 and the side surface of the passivation layer 60 make a same plane, and then forming the light conversion layer 70 outside of the passivation layer 60.

FIGS. 5A through 5H are cross-sectional views sequentially illustrating a method of manufacturing the light emitting apparatus 100 according to an exemplary embodiment of the present disclosure. Hereinafter, a case in which the light emitting device is formed through a process of forming two or more light emitting stack structures 20 on the substrate 10 and cutting them thereafter will be described as an example.

First, referring to FIG. 5A, the light emitting stack structure 20 and the first and second electrodes 31 and 33 are formed on the substrate 10.

The light emitting stack structure 20 may be formed by being sequentially epitaxially grown on the substrate 10. However, the method of forming the light emitting stack structure 20 is not limited thereto, and the light emitting stack structure 20 may be separately formed and disposed on the substrate 10 thereafter.

Next, the first insulation layer 51 is formed on the light emitting stack structure 20. The first insulation layer 51 may be formed by forming an insulating material through deposition or the like and patterning it thereafter using a photo-lithography process. The first and second electrodes 31 and 33 may be formed on the first insulation layer 51 by forming a metallic layer through deposition and patterning the metal-lic layer thereafter using the photolithography process. The second insulation layer 53 is formed on the first and second electrodes 31 and 33, and the first insulation layer 51. The second insulation layer 53 may be formed by forming an insulating material through deposition or the like and then patterning it using a photolithography process.

Herein, the method of forming the first and/or second insulation layers 51 and 53 and the first and/or second electrodes 31 and 33 is described as an example using the photolithography in this exemplary embodiment, but the inventive concepts are not limited thereto, and various known methods may be used.

Referring to FIG. 5B, the first and second bumps 41 and 43 are formed on a light emitting structure layer on which the first and second electrodes 31 and 33 are formed.

The first and second bumps 41 and 43 may be formed by dotting solder paste on the first and second electrodes 31 and 33, and reflowing it to cover portions of upper surfaces of the end portions of the second insulation layer 53 near regions where the first and second through holes TH1 and TH2 are formed in addition to regions where the first and second electrodes 31 and 33 are provided. In the reflow process, slopes of side surfaces of the first and second bumps 41 and 43 become gentler than when they are first dotted, but they are still inclined. In this way, the side surfaces of the first and second bumps 41 and 43 are inclined to cover an upper surface of the second insulation layer 53 around the first and second through holes TH1 and TH2, and thus, an effect of mitigating a crack occurrence in the light emitting stack structure 20 and the first and second insulation layers 51 and 53, particularly, a crack occurrence in the second insulation layer 53 may be seen.

In addition, by forming the first and second bumps 41 and 43 with solder paste, there is an advantage that an electrode portion connecting the light emitting stack structure 20 and an external interconnection may be simply formed. The first and second bumps 41 and 43 may be formed just through a simple reflow process.

Referring to FIG. SD, the passivation layer 60 completely covering the light emitting stack structure 20 and the first and second bumps 41 and 43 is formed.

The passivation layer 60 may be formed by entirely applying a polymer resin having fluidity before curing on the substrate 10 on which the first and second bumps 41 and 43 are formed. Herein, although the upper surface of the passivation layer 60 is illustrated as being flat in FIG. 5D, this is for convenience of description, and the upper surface of the actual passivation layer may have irregularities formed thereon depending on the presence or absence of light emitting devices.

Next, referring to FIG. 5E, the upper surface of the passivation layer 60 is ground, and the upper surfaces of the first and second bumps 41 and 43 are exposed to the outside by the grinding. Herein, since the upper surfaces of the first and second bumps 41 and 43 are exposed by grinding, they correspond to a same plane as the upper surface of the passivation layer 60.

Thereafter, referring to FIG. 5F, the passivation layer 60 and the substrate 10 are cut along a cutting line CL using a cutter CT, so that each of light emitting devices is individu-alized. At this time, since the passivation layer 60 and the substrate 10 are simultaneously cut, the side surface of the substrate 10 and the side surface of the passivation layer 60 make a same plane.

Referring to FIG. 5G, each light emitting device CP diced and individualized is inverted and disposed on a substrate 11 so as to form the light conversion layer 70. In this case, the substrate 11 may be a device substrate such as a printed circuit board, or may simply be a temporary substrate for forming the light conversion layer 70. A single light emitting device CP or a plurality of light emitting devices CP may be disposed on the substrate 11, and the plurality of light emitting devices CP is shown in the drawing.

A material of the light conversion layer 70 is applied on the disposed light emitting devices CP. The material of the light conversion layer 70 may be a polymer resin including a light conversion material such as a phosphor, and may have fluidity. Accordingly, the material of the light conver-sion layer 70 is applied to each of the light emitting devices in a shape completely covering the upper and side surfaces of each of the light emitting devices.

Thereafter, as shown in FIG. 5H, after the material of the light conversion layer 70 is cured, the light emitting devices are cut into individual light emitting apparatuses using a cutter CT'.

In the drawing, the cutter CT' is shown in a shape of a circular rotary cutter, but this is shown as an example. In an exemplary embodiment of the present disclosure, the shape of the cutter CT' may have various other shapes, of course.

As described above, according to an exemplary embodi-ment of the present disclosure, it is possible to manufacture a highly reliable light emitting apparatus 100 in a simpler method compared to that of a prior art.

In the above-described exemplary embodiment, it has been described as an example that the upper surfaces of the first and second bumps 41 and 43 are exposed to the outside through the grinding process after forming the passivation layer 60. However, in another exemplary embodiment of the present disclosure, it is possible to expose the upper surfaces of the first and second bumps 41 and 43 to the outside using the photolithography process instead of the grinding pro-cess.

FIG. 6 is a cross-sectional view of the light emitting apparatus 100 manufactured using the photolithography process, and FIGS. 7A and 7B are cross-sectional views showing parts of a method of manufacturing the light emitting apparatus 100 of FIG. 6.

Referring to FIG. 6, in the light emitting apparatus 100 manufactured using the photolithography process, the upper surfaces of the first and second bumps 41 and 43 are provided on a location close to the light emitting stack structure 20 from the upper surface of the passivation layer 60. That is, bump holes BH are provided in the passivation layer 60 so as to expose the upper surfaces of the first and second bumps 41 and 43, and the bump holes have a shape recessed from the upper surfaces of the passivation layer.

The light emitting apparatus of the above type may be manufactured through a same process as in the above-described exemplary embodiment except that the photoli-thography process is substituted for the grinding process after an application process of the passivation layer 60. Accordingly, the process using photolithography after the application process of the passivation layer 60 will be described below.

Referring to FIG. 7A, after forming the passivation layer 60, a mask MSK is disposed on the passivation layer 60 and the passivation layer 60 is irradiated with light. Herein, the passivation layer 60 is made of a photosensitive material, and accordingly, a predetermined reaction proceeds by irradiation with light. The passivation layer 60 may be a positive type or a negative type with respect to light, and may be selected if necessary.

Referring to FIG. 7B, the photosensitive passivation layer 60 exposed in FIG. 7A is patterned into a predetermined pattern through development. Accordingly, as shown in FIG. 7B, portions of the passivation layer 60 where the first and second bumps 41 and 43 are formed are removed, so that the upper surfaces of the first and second bumps 41 and 43 are exposed to the outside.

FIG. 8 is a schematic cross-sectional view illustrating a light emitting apparatus according to an exemplary embodiment of the present disclosure.

Referring to FIG. 8, a light emitting apparatus 200a according to this exemplary embodiment is substantially similar to the light emitting apparatus 100 described with reference to FIGS. 1A, 1B, and 2, except that a passivation layer 260a further covers the side surface of the substrate 10. Hereinafter, to avoid redundancy, components identical or similar to those of the light emitting apparatus 100 described with reference to FIGS. 1A, 1B, and 2 are denoted by same reference numerals and detailed descriptions thereof are omitted.

The passivation layer 260a covers the side surface of the substrate 10 together with the light emitting stack structure 20. A material of the passivation layer 260a may be same as that of the passivation layer 60 previously described with reference to FIGS. 1A, 1B, and 2. Meanwhile, in the present embodiment, the passivation layer 260a is illustrated as filling a region between the first bump 41 and the second bump 43, but the present embodiment is not limited thereto. That is, the region between the first bump 41 and the second bump 43 may not be filled with the passivation layer 260a, and may remain empty.

A light conversion layer 270 may cover the passivation layer 260a together with the substrate 10 or may be formed on an upper surface. In this exemplary embodiment, the light conversion layer 270 may have a flat shape as shown. In this exemplary embodiment, the light conversion layer 270 may be formed using a cured resin as described above with reference to FIGS. 1A and 1B, and in addition, may be, for example, a wavelength conversion sheet attached to the substrate 10 and the passivation layer 260a, a ceramic phosphor, or a coating layer coated on a glass substrate. However, in this exemplary embodiment, the light conversion layer 270 is not limited to the flat shape, and the light conversion layer 270 may cover a side surface of the passivation layer 260a as in the embodiment described with reference to FIG. 2.

In a specific embodiment, a reflection layer 250 may be disposed between the substrate 10 and the light conversion layer 270. The reflection layer 250 may include a metallic reflection layer and/or a distributed Bragg reflector. The side surface of the passivation layer 260a may be formed parallel to the side surface of the substrate 10, and the reflection layer 250 may be formed perpendicular to the side surface of the passivation layer 260a, thereby increasing light emission efficiency to the side surface. The reflection layer 250 may be formed so as to contact a lower surface of the substrate 10. The reflection layer 250 reflects light generated in the light emitting stack 20 and directly incident to the light conversion layer 270 through the substrate 10. By disposing the reflection layer 250, a viewing angle of light emitted from the light emitting apparatus 200a may be widened. In particular, when a plurality of light emitting apparatuses 200a is arranged and used as a backlight of a display apparatus or a light source of a flat lighting apparatus, it is possible to prevent a spot from being observed.

When the reflection layer 250 is employed and the first insulation layer 51 and/or the second insulation layer 53 include the distributed Bragg reflector, light generated in the light emitting stack structure 20 may be emitted to a side surface of the light emitting device CP. The insulation layer 51 or 53 formed on side surfaces of a semiconductor layer and a mesa may be extended to the upper surface of the substrate 10, and in this case, a length between both ends of the insulation layer 51 or 53 may be same as that of the reflection layer 250 formed on the lower surface of the substrate 10. Accordingly, light emitted from the light emitting stack structure 20 may be concentrated through the side surface of the substrate 10. Light emitted to the side surface may be finally wavelength-converted through the light conversion layer 270, and for this purpose, the light conversion layer 270 may have a width relatively greater than that of the substrate 10.

The light emitting apparatus 260a of this exemplary embodiment is not necessarily limited to including the reflection layer 250, and the reflection layer 250 may be omitted.

FIG. 9 is a schematic cross-sectional view illustrating a light emitting apparatus according to an exemplary embodiment of the present disclosure.

Referring to FIG. 9, a light emitting apparatus 200b according to this exemplary embodiment is substantially similar to the light emitting apparatus 200a described with reference to FIG. 8, except that a passivation layer 260b further covers the lower surface of the substrate 10.

That is, the passivation layer 260b may cover the upper surface, the side surfaces, and the lower surface of the substrate 10. The reflection layer 250 may be disposed between the substrate 10 and the passivation layer 260b, and further, may be formed to contact the lower surface of the substrate 10.

The light conversion layer 270 may be spaced apart from the substrate 10, and by-products generated in the light conversion layer 270 may be further prevented from infiltrating into a light emitting device CP by the passivation layer 260b disposed between the light conversion layer 270 and the substrate 10. In this exemplary embodiment, the light conversion layer 270 is shown as being in contact with the passivation layer 260b, but the present embodiment is not limited thereto, and another material layer may be interposed between the light conversion layer 270 and the passivation layer 260b.

FIG. 10 is a schematic cross-sectional view illustrating a light emitting apparatus according to an exemplary embodiment of the present disclosure.

Referring to FIG. 10, a light emitting apparatus 200c according to this exemplary embodiment is substantially similar to the light emitting apparatus 200b described with reference to FIG. 9, except that it further includes a second passivation layer 260c.

The second passivation layer 260c may cover a lower surface and side surfaces of the first passivation layer 260b. The second passivation layer 260c may have a different composition or density than that of the first passivation layer 260b. In this exemplary embodiment, the first and second passivation layers 260b and 260c are formed of a material that transmits light generated in the light emitting stack structure 20. Since the first and second passivation layers 260b and 260c are disposed between the light conversion layer 270 and the substrate 10, infiltration of by-products may be further prevented.

FIG. 11 is a schematic cross-sectional view illustrating a light emitting apparatus according to an exemplary embodiment of the present disclosure.

A light emitting apparatus 200d according to this exemplary embodiment is substantially similar to the light emitting apparatus 200c described with reference to FIG. 10, except that a second passivation layer 260d does not cover the side surfaces of the first passivation layer 260b. That is, the second passivation layer 260d may be limitedly disposed between the light conversion layer 270 and the first passivation layer 260d.

In this exemplary embodiment, the second passivation layer 260d may have a different composition or density than that of the first passivation layer 260b. Furthermore, the second passivation layer 260d and the first passivation layer 260b may transmit light generated in the light emitting stack structure 20. However, the present embodiment is not limited thereto, and the second passivation layer 260d may include a material that blocks or reflects light. For example, the first passivation layer 260b may be formed of transparent silicone, and the second passivation layer 260d may be formed of white silicone. When the second passivation layer 260d includes a reflective material, the reflection layer 250 may be omitted. When the second passivation layer 260d includes the reflective material, the light conversion layer 270 has a width greater than that of the second passivation layer 260d.

FIG. 12 is a schematic cross-sectional view illustrating a light emitting apparatus according to an exemplary embodiment of the present disclosure.

Referring to FIG. 12, a light emitting apparatus 200e according to this exemplary embodiment is substantially similar to the light emitting apparatus 200a described with reference to FIG. 8, except that a side surface of a passivation layer 260e is curved. The passivation layer 260e may have a larger width as it is closer to the light conversion layer 270, and may have a smaller width as it is closer to the first and second bumps 41 and 43. In addition, a tangential slope of an outer surface of the passivation layer 260e formed on the side surface of the substrate 10 may be greater than a tangential slope of the outer surface of a passivation layer formed on a side surface of a mesa. Through this, extraction efficiency of light emitted from the side surface of the substrate may be increased.

FIG. 13 is a schematic cross-sectional view illustrating a product including a light emitting apparatus according to an exemplary embodiment of the present disclosure. In this exemplary embodiment, a product 300a may be a backlight light source of a display apparatus or a light source of a lighting apparatus, without being limited thereto, and may be various products including a plurality of light emitting apparatuses 100.

Referring to FIG. 13, the product 300a includes a device substrate 310 and a plurality of light emitting apparatuses 100.

The device substrate 310 may be made of a robust material, without being limited thereto, and may be made of a flexible material. When the product 300a according to an exemplary embodiment of the present disclosure is implemented as a curved or bendable display apparatus, it may be advantageous that the device substrate 310 is formed of the flexible material. In an exemplary embodiment of the present disclosure, when the device substrate 310 is formed of a material such as glass, quartz, metal, or the like, it has a relatively high heat resistance compared to an organic polymer device substrate, so that it has an advantage of being able to stack various things on an upper surface thereof.

When the device substrate 310 is formed of a transparent material such as glass or quartz, it may be advantageous in manufacturing a front or a bottom emission display apparatus. When the device substrate 310 is made of an organic polymer or an organic-inorganic composite, it may have relatively high flexibility and may be advantageous in manufacturing a curved display apparatus. A reflective material layer 320 or an insulating protection layer such as a solder resist or a coverlay may be further provided on the device substrate 310 in addition to an interconnection portion.

In an exemplary embodiment of the present disclosure, the device substrate 310 may include an interconnection portion formed inside or outside of the device substrate 310. For example, in an exemplary embodiment of the present disclosure, the device substrate 310 may be a printed circuit board, and when the device substrate 310 is provided as the printed circuit board, an interconnection portion connected to a light emitting device may be provided on the printed circuit board.

The interconnection portion may be made of a conductive metal, and may be, for example, at least one selected from a group consisting of gold, silver, copper, iron, nickel, aluminum, chromium, titanium, palladium, tungsten, rhodium, and alloys thereof. The interconnection portion may be made of a single layer or multiple layers.

The light emitting apparatus 100 may be bonded to the interconnection portion of the device substrate 310 using bumps. A plurality of light emitting apparatuses 100 may be arranged on the device substrate 310. Meanwhile, the light emitting apparatus 100 may be driven by supplying power to a light emitting device CP through the interconnection portion of the device substrate 310. The light emitting device CP that has received power emits light, and light is emitted to the outside through a light transmitting portion.

The reflective material layer 320 may be formed on an upper surface of the device substrate 310, and prevents light emitted from the light emitting apparatuses 100 from being absorbed by the device substrate 310 and being lost. The reflective material layer 320 may be disposed on a solder resist, without being limited thereto, and may be a white solder resist.

In this exemplary embodiment, the light emitting apparatuses 100 have been exemplarily described, without being limited thereto, and the light emitting apparatuses 100' or 100" described with reference to FIG. 3 or 4 may be disposed on the device substrate 310.

FIG. 14 is a schematic cross-sectional view illustrating a product 300b including a light emitting apparatus according to an exemplary embodiment of the present disclosure.

Referring to FIG. 14, the product 300b according to this exemplary embodiment is similar to the product 300a described with reference to FIG. 13, except the light emitting apparatus 200 is the light emitting apparatus 200a, 200b, 200c, 200d, or 200e described with references to FIGS. 8 through 12.

In this exemplary embodiment, since the light emitting apparatus 200 is same as the light emitting apparatus 200a, 200b, 200c, 200d, or 200e previously described with reference to FIGS. 8 through 12, a detailed description thereof will be omitted.

In this exemplary embodiment, each of light emitting apparatuses 200 includes a passivation layer 260 covering the side surface of the substrate 10. In addition, a light conversion layer 270 may have a flat plate shape.

FIG. 15A is a schematic cross-sectional view illustrating a product including a light emitting apparatus according to an exemplary embodiment of the present disclosure, and FIG. 15B is a schematic plan view illustrating the product including the light emitting apparatus according to an exemplary embodiment of the present disclosure.

Referring to FIG. 15A, a product 300*c* according to this exemplary embodiment is substantially similar to the product 300*b* described with reference to FIG. 14, except that a single light conversion layer 270*a* covers a plurality of light emitting apparatuses 200*a*. That is, in the exemplary embodiment of FIG. 14, each of the light emitting apparatuses 200 includes the light conversion layer 270, and these light conversion layers 270 are spaced apart from one another, but in this exemplary embodiment, a single continuous light conversion layer 270*a* covers the plurality of light emitting apparatuses 200*a*.

The light conversion layer 270*a* may be, for example, a wavelength conversion sheet, a ceramic phosphor, or a layer coated on a glass substrate. Since the plurality of light emitting apparatuses 270*a* is covered using one wide light conversion layer 270*a*, a manufacturing process of the light conversion layer 270*a* may be simplified.

In this exemplary embodiment, a region between the light emitting apparatuses 200*a* may be an empty space, without being limited thereto, and may be filled with a transparent or opaque film.

In FIG. 14, a light reflection layer 320 is illustrated and described as being disposed outside of the passivation layer 260, but as shown in FIG. 15, the passivation layer 260 may be formed so as to cover a portion of the light reflection layer 320, and light propagation through the passivation layer 260 covering a partial region of the light reflection layer 320 may be performed well. In addition, the inventive concepts are not limited thereto, and the light reflection layer 320 may be formed to extend to a lower surface of a light emitting device.

Meanwhile, light emitting devices CP may be arranged in a matrix shape as shown in FIG. 15B. When the light emitting devices CP have a square shape, intervals between the light emitting devices CP may be same in a row direction and a column direction. As shown in FIG. 15B, when the light emitting devices CP have a rectangular shape, a distance D1 between side surfaces of the light emitting devices CP in a longitudinal direction of the light emitting devices CP may be smaller than a distance D2 between the side surfaces of the light emitting devices CP in a direction perpendicular to the longitudinal direction of the light emitting devices CP. Since an intensity of light emitted from the side surface having a relatively large area is relatively large, by setting a distance between the side surfaces having a large area to be larger than a distance between the side surfaces having a small area, a display apparatus or a lighting apparatus that is configured to realize uniform light emission may be provided.

Meanwhile, a distance between adjacent passivation layers may be same in both the row direction and the column direction. That is, as shown in FIG. 15B, a distance D3 between side surfaces of the passivation layers 260 in a row direction parallel to the longitudinal direction of the light emitting devices CP may be same as a distance D4 between the side surfaces of the passivation layers 260 in a column direction perpendicular to the longitudinal direction of the light emitting devices CP.

FIG. 16 is a schematic cross-sectional view illustrating a light emitting apparatus according to an exemplary embodiment of the present disclosure.

Referring to FIG. 16, a light emitting apparatus 400 according to this exemplary embodiment may include a mount 410, a light emitting device CP, a passivation layer 460, a light conversion layer 470, and a white wall 490.

The mount 410 is for mounting the light emitting device CP, and may include leads or interconnections. The mount 410 may be a printed circuit board, in particular, a ceramic board.

The light emitting device CP is same as the light emitting device CP described with reference to FIGS. 1A, 1B, and 2, and a detailed description thereof is omitted to avoid redundancy. The light emitting device CP is mounted on the mount 410. The light emitting device CP may be bonded to the mount 410 using bumps (41 and 43 in FIG. 2).

The white wall 490 is disposed around the light emitting device CP. The white wall 490 may be formed on the mount 410 using, for example, an epoxy molding compound or a silicone molding compound. The white wall 490 may include a reflective or scattering material, and may reflect light generated from the light emitting device CP.

The white wall 490 may contact a side surface of the light emitting device CP, or may be spaced apart from the side surface. The white wall 490 is spaced apart from an upper surface of a substrate 10, and a separation space is formed between the white wall 490 and the substrate 10.

The passivation layer 460 fills a region between the white wall 490 and the light emitting device CP. The passivation layer 460 may also cover the upper surface of the substrate 10. Since a material of the passivation layer 460 is same as that described with references to FIGS. 1A and 1B, a detailed description thereof is omitted to avoid redundancy.

The light conversion layer 470 is disposed on the light emitting device CP. The light conversion layer 470 may be attached on the light emitting device CP through the passivation layer 460. The passivation layer 460 may be disposed on a path through which by-products generated in the light conversion layer 470 proceed to a metallic material on the light emitting device CP, and thus, the light emitting device CP may be protected.

In this exemplary embodiment, it is illustrated and described that the passivation layer 460 is interposed between the light conversion layer 470 and the light emitting device CP, but the inventive concepts are not limited thereto. For example, the passivation layer 470 may be formed so as to cover the side surface of the light emitting device CP, and the light conversion layer 470 may directly contact the light emitting device CP.

FIG. 17 is a schematic cross-sectional view illustrating a light emitting apparatus according to an exemplary embodiment of the present disclosure.

Referring to FIG. 17, a light emitting apparatus 500 according to this exemplary embodiment is similar to the light emitting apparatus 400 described with reference to FIG. 16, except that a plurality of light emitting devices CP is disposed on the mount 410.

Similar to the white wall 490 described with reference to FIG. 16, a white wall 590 may be formed on the mount 410 using an epoxy molding compound or a silicone molding compound. The white wall 590 may include a reflective or scattering material, and may reflect light generated from the light emitting devices CP.

The white wall 590 may contact side surfaces of the light emitting devices CP, or may be spaced apart from the side surfaces of the light emitting devices CP. The white wall 590 may also be disposed between the light emitting devices CP. The white wall 590 is spaced apart from the upper surface of the substrate 10, and a separation space is formed between the white wall 590 and the substrate 10.

The passivation layer 560 fills a region between the white wall 590 and the light emitting device CP.

A height of the white wall 590 formed between the light emitting devices CP may be lower than that of the white wall 590 formed on an outer circumferential surface of the light emitting device. In addition, the white wall 590 formed between the light emitting devices may increase reflection efficiency by forming a higher center portion between the devices.

The passivation layer 560 may also cover the upper surface of the substrate 10. Since a material of the passivation layer 560 is same as that described with references to FIGS. 1A and 1B, a detailed description thereof is omitted to avoid redundancy.

The light conversion layer 570 may cover the plurality of light emitting devices CP. The light conversion layer 570 may be attached on the light emitting devices CP through the passivation layer 560. The passivation layer 560 may be disposed on a path through which by-products generated in the light conversion layer 570 proceed to a metallic material on the light emitting devices CP, thereby protecting the light emitting devices CP.

In this exemplary embodiment, it is illustrated and described that the passivation layer 560 is interposed between the light conversion layer 570 and the light emitting devices CP, but the inventive concepts are not limited thereto. For example, the passivation layer 570 may be formed so as to cover the side surfaces of the light emitting devices CP, and the light conversion layer 570 may directly contact the light emitting devices CP.

Although the preferred embodiment of this invention has been described above, it will be understood by those skilled in the art or those having ordinary knowledge in the art that this invention can be modified and changed in various ways without departing from the spirit and technical scope of this invention described in the claims to be described below.

Therefore, the technical scope of this invention is not limited to the contents described in the detailed description of the specification, but should be defined by the claims.

The invention claimed is:

1. A light emitting apparatus, comprising:
a substrate including a first region and a second region;
a light emitter disposed on the first region of the substrate;
first and second electrodes provided on the light emitter;
first and second bumps provided on the first and second electrodes, respectively;
a first passivation material provided on an upper surface of the second region of the substrate;
a first insulation layer provided between the light emitter and the first passivation material, wherein the first passivation material includes a material different from that of the first insulation layer;
a second passivation material disposed on the first passivation material and including white material that blocks or reflects light emitted from the light emitter; and
a second insulation layer provided between the first insulation layer and the first passivation material and having first and second through holes exposing portions of upper surfaces of the first and second electrodes,
wherein a side surface of the second passivation material is positioned on a same plane as a side surface of the first passivation material, and
wherein the first and second bumps cover portions of the first and second electrodes around the first and second through holes, respectively.

2. The light emitting apparatus of claim 1,
wherein the first insulation layer is disposed between the light emitter and the first electrode, and between the light emitter and the second electrode, and extends outward from a side surface of the light emitter and covers a portion of the upper surface of the second region of the substrate.

3. The light emitting apparatus of claim 1,
wherein the second insulation layer extends outward from the side surface of the light emitter, and covers an end portion of the first insulation layer and a portion of the upper surface of the second region of the substrate.

4. The light emitting apparatus of claim 1,
wherein the first passivation material covers an end portion of the second insulation layer positioned on the substrate.

5. The light emitting apparatus of claim 4,
wherein a distance between the end portion of the second insulation layer positioned on the substrate and the side surface of the first passivation material is 10 micrometers or more.

6. The light emitting apparatus of claim 1,
wherein the first and second bumps have side surfaces inclined with respect to upper surfaces of the first and second electrodes.

7. The light emitting apparatus of claim 1,
wherein upper surfaces of the first and second bumps are positioned on a same plane as an upper surface of the first passivation material.

8. The light emitting apparatus of claim 1,
wherein upper surfaces of the first and second bumps are provided at positions that are recessed from an upper surface of the first passivation material toward the light emitter.

9. The light emitting apparatus of claim 1,
wherein the first passivation material includes a transparent moisture resistant material.

10. The light emitting apparatus of claim 1, further comprising:
a light conversion layer including a phosphor that is configured to convert at least a portion of light emitted from the light emitter into light of a different wavelength.

11. The light emitting apparatus of claim 10,
wherein the phosphor includes at least one of a green phosphor or a yellow phosphor; and a red phosphor.

12. The light emitting apparatus of claim 10, further comprising:
a red phosphor layer provided on a rear surface of the substrate,
wherein the phosphor provided in the light conversion layer is at least one of a green phosphor and a yellow phosphor.

13. The light emitting apparatus of claim 10, further comprising:
a protection layer provided on an outer surface of the light conversion layer.

14. The light emitting apparatus of claim 13,
wherein the protection layer includes at least one of silicone or a glass filler.

15. A product, comprising:
a device substrate;
light emitting devices disposed on the device substrate;
a first passivation material covering each of the light emitting devices; and

a second passivation material disposed on the first passivation material and including white material that blocks or reflects light emitted from each of the light emitting devices, wherein a side surface of the second passivation material is positioned on a same plane as a side surface of the first passivation material, and wherein at least one of the light emitting devices comprises:

a substrate;

a light emitter disposed on a first region of the substrate;

first and second electrodes provided on the light emitter;

first and second bumps respectively provided on the first and second electrodes, respectively, a first insulation layer provided between the light emitter and the first passivation material, wherein the first passivation material includes a material different from that of the first insulation layer; and a second insulation layer provided between the first insulation layer and the first passivation material and having first and second through holes exposing portions of upper surfaces of the first and second electrodes, wherein the first and second bumps cover portions of the first and second electrodes around the first and second through holes, respectively.

16. The product of claim 15, wherein each of the light emitting devices is mounted on the device substrate through the first and second bumps.

17. The product of claim 16, further comprising:

a light conversion layer covering the first passivation material and including fluorine, wherein a portion of the first passivation material is disposed between the light conversion layer and the substrate.

18. The product of claim 15, further comprising:

a light reflection layer disposed on the device substrate.

19. The product of claim 18, wherein the first passivation material covers a portion of the light reflection layer.

* * * * *